United States Patent
Doshi et al.

(10) Patent No.: US 11,927,889 B2
(45) Date of Patent: Mar. 12, 2024

(54) INTERMEDIATE LAYER FOR MECHANICAL INTERFACE

(71) Applicant: ASML Holding N.V., Veldhoven (NL)

(72) Inventors: Kushal Sandeep Doshi, Norwalk, CT (US); Eric Justin Monkman, Fairfield, CT (US); John Robert Burroughs, Bethel, CT (US); Sudhanshu Nahata, Stamford, CT (US); Stefan Luka Colton, New York, NY (US)

(73) Assignee: ASML Holding N.V., Veldhoven (NL)

( * ) Notice: Subject to any disclaimer, the term of this patent is extended or adjusted under 35 U.S.C. 154(b) by 210 days.

(21) Appl. No.: 17/430,275

(22) PCT Filed: Jan. 27, 2020

(86) PCT No.: PCT/EP2020/051950
§ 371 (c)(1),
(2) Date: Aug. 11, 2021

(87) PCT Pub. No.: WO2020/164898
PCT Pub. Date: Aug. 20, 2020

(65) Prior Publication Data
US 2022/0113639 A1    Apr. 14, 2022

Related U.S. Application Data

(60) Provisional application No. 62/804,915, filed on Feb. 13, 2019.

(51) Int. Cl.
*G03F 7/00* (2006.01)

(52) U.S. Cl.
CPC ...... *G03F 7/70716* (2013.01); *G03F 7/70741* (2013.01); *G03F 7/70808* (2013.01); *G03F 7/7085* (2013.01); *G03F 7/7095* (2013.01)

(58) Field of Classification Search
CPC ............ G03F 7/70716; G03F 7/70808; G03F 7/7095; G03F 7/70741; G03F 7/7085;
(Continued)

(56) References Cited

U.S. PATENT DOCUMENTS

| | | | |
|---|---|---|---|
| 6,808,952 | B1 | 10/2004 | Sniegowski et al. |
| 8,349,436 | B2 | 1/2013 | Gomi |

(Continued)

FOREIGN PATENT DOCUMENTS

| | | |
|---|---|---|
| CN | 101391496 A | 3/2009 |
| CN | 102159997 A | 8/2011 |

(Continued)

OTHER PUBLICATIONS

International Search Report and Written Opinion of the International Searching Authority directed to related International Patent Application No. PCT/EP2020/051950, dated May 12, 2020; 9 pages.
Chinese Office Action directed to Chinese Patent Application No. 202080014571.4, dated Nov. 27, 2023; 10 pages.

*Primary Examiner* — Deoram Persaud
(74) *Attorney, Agent, or Firm* — Sterne, Kessler, Goldstein & Fox P.L.L.C.

(57) ABSTRACT

An apparatus includes a first substrate, a second substrate, and an intermediate layer disposed between the first and second substrates. The intermediate layer is configured to be a first point of failure or breakage of the apparatus under an applied force. The apparatus can further include a bonding layer disposed between the first and second substrates. The bonding layer is configured to bond the intermediate layer to the first and second substrates. The apparatus can further include a fastener coupled to the first and second substrates. The fastener is configured to secure the intermediate layer to the first and second substrates. The intermediate layer can include a coating applied to the first substrate or the second (Continued)

substrate. The apparatus can further include a second intermediate layer disposed between the first substrate and the fastener or the second substrate and the fastener.

16 Claims, 10 Drawing Sheets

(58) Field of Classification Search
CPC ..... B29C 33/68; B29C 35/02; B29C 37/0025; B29C 37/0053; B29C 63/02; B29C 65/48; F16B 11/006; F16B 5/02; C09J 7/25; C09J 7/38; C09J 7/401; A45D 29/001; B29L 2031/7286; C09D 5/24
See application file for complete search history.

(56) References Cited

U.S. PATENT DOCUMENTS

| | | |
|---|---|---|
| 8,430,514 B2 | 4/2013 | Von Blanckenhagen |
| 2003/0162104 A1 | 8/2003 | Shoki |
| 2005/0132750 A1 | 6/2005 | Elp |
| 2006/0043567 A1 | 3/2006 | Palanduz |
| 2007/0216881 A1 | 9/2007 | Van Der Schoot et al. |
| 2007/0281149 A1 | 12/2007 | Martens et al. |
| 2016/0126215 A1 | 5/2016 | Imbert et al. |

FOREIGN PATENT DOCUMENTS

| | | |
|---|---|---|
| WO | WO 2009/032197 A1 | 3/2009 |
| WO | WO 2017/060259 A1 | 4/2017 |

US 11,927,889 B2

INTERMEDIATE LAYER FOR MECHANICAL INTERFACE

CROSS-REFERENCE TO RELATED APPLICATIONS

This application claims priority of U.S. Provisional Patent Application No. 62/804,915, which was filed on Feb. 13, 2019, and which is incorporated herein in its entirety by reference.

FIELD

The present disclosure relates to intermediate or sacrificial layer(s) for bonding and/or clamping apparatuses, for example, a bonding or a clamping apparatus for lithography apparatuses and systems.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

The joining together of pieces of material is a common operation for most manufacturing processes, including lithographic processes. The use of epoxies or adhesive materials to attach together components in lithographic and semiconductor manufacturing processes is known in the art. Current methods to bond or adhere components, for example, a metal layer and a ceramic layer (e.g., glass) interface, introduces thermal stress between the layers due to a difference in coefficient of thermal expansion (CTE).

Further, using fasteners (e.g., clamps, bolts, etc.) to join pieces of material can cause breakage or cracks in one or both of the layers joined. Moreover, stress concentrations can occur due to imperfections between the adjoining surfaces. Because of the advantages and versatility of epoxy or adhesive bonding, there is a need to bond pieces with epoxy without damaging the bonded pieces and reduce thermal stresses in a convenient and efficient manner. Additionally, because of the advantages of directly fastening pieces without using epoxy, there is a need to fasten pieces without damaging the fastened pieces and reduce the risk of breakage and stress concentrations in a convenient and efficient manner.

SUMMARY

In some embodiments, a lithography system includes a radiation source for providing radiation energy to a reticle, a reticle stage configured to hold the reticle, and an intermediate apparatus coupled to the reticle stage. In some embodiments, the intermediate apparatus includes a first substrate, a second substrate, and an intermediate layer disposed between the first and second substrates. In some embodiments, the intermediate layer is configured to be a first point of failure or breakage of the intermediate apparatus under an applied force. In some embodiments, the intermediate layer comprises a low coefficient of thermal expansion or ultra-low expansion material.

In some embodiments, the intermediate apparatus is configured to reduce damage to the reticle stage under the applied force. In some embodiments, the lithography system further includes a clamp coupled to the reticle stage and configured to secure the reticle. In some embodiments, the radiation energy is extreme ultraviolet (EUV) radiation. In some embodiments, the intermediate layer includes ZERODUR®, a tempered ceramic, or a plastic.

In some embodiments, an apparatus for a reticle stage in a lithographic apparatus includes a first substrate, a second substrate, and an intermediate layer disposed between the first and second substrates. In some embodiments, the intermediate layer is configured to be a first point of failure or breakage of the apparatus under an applied force. In some embodiments, the apparatus is coupled to the reticle stage and configured to reduce damage to the reticle stage under the applied force.

In some embodiments, the intermediate layer has a stiffness, a compression strength, or a coefficient of thermal expansion substantially equivalent to that of the second substrate. In some embodiments, the intermediate layer has a lower ultimate tensile strength to that of the second substrate. In some embodiments, the intermediate layer has a lower cross-sectional area to that of the second substrate. In some embodiments, the intermediate layer has a higher surface roughness to that of the second substrate.

In some embodiments, the intermediate layer includes a low coefficient of thermal expansion material. For example, the intermediate layer can include ZERODUR®, a tempered ceramic, or a plastic. In some embodiments, the second substrate includes a low coefficient of thermal expansion material.

In some embodiments, the apparatus further includes a bonding layer disposed between the first and second substrates. The bonding layer is configured to bond the intermediate layer to the first and second substrates. In some embodiments, the intermediate layer includes a groove configured to ventilate the bonding layer. In some embodiments, the bonding layer comprises an epoxy, elastomer, or thermoplastic.

In some embodiments, an apparatus for a reticle stage in a lithographic apparatus includes a first substrate, a second substrate, an intermediate layer disposed between the first and second substrates, and a fastener coupled to the first and second substrates. In some embodiments, the intermediate layer is configured to be a first point of failure or breakage of the apparatus under an applied force. In some embodiments, the fastener is configured to secure the intermediate layer to the first and second substrates. In some embodiments, the apparatus is coupled to the reticle stage and configured to reduce damage to the reticle stage under the applied force.

In some embodiments, the intermediate layer has a lower elastic modulus to that of the first and second substrates. In some embodiments, the intermediate layer has a lower yield strength to that of the first and second substrates. In some embodiments, the intermediate layer has a lower cross-sectional area to that of the second substrate. In some embodiments, the intermediate layer has a higher surface roughness to that of the second substrate.

In some embodiments, the intermediate layer includes a polymer or a metal. In some embodiments, the intermediate layer includes a coating applied to the first substrate or the second substrate. In some embodiments, the apparatus further includes a second intermediate layer disposed between the first substrate and the fastener or the second substrate and the fastener. In some embodiments, the fastener includes a bolt, a nut, a clamp, a spring, a flexure, or some combination thereof.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention will now be described, by way of example only, with reference to the accompanying schematic drawings, in which.

Figure 1:
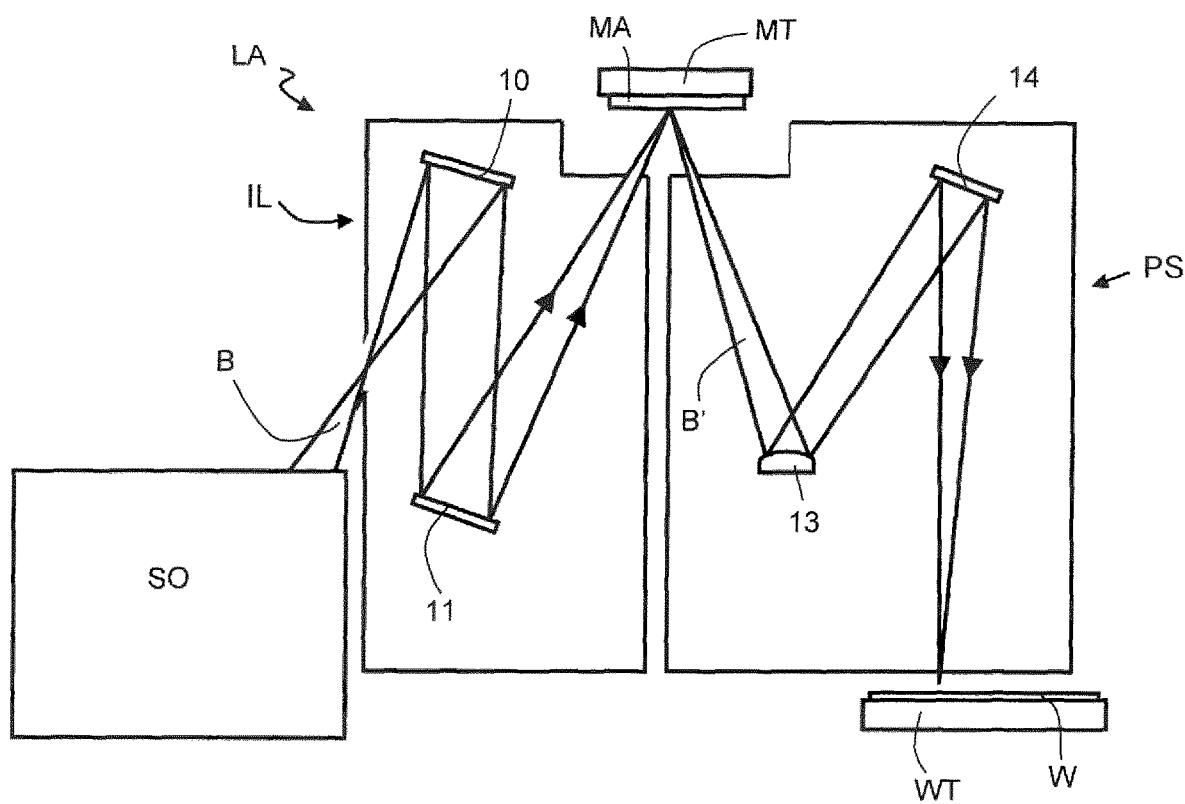
FIG. 1 is a schematic illustration of a lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "bottom," "beneath," "below," "lower," "top," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

The term "substantially" as used herein indicates the value of a given quantity that can vary based on a particular technology. Based on the particular technology, the term "substantially" can indicate a value of a given quantity that varies within, for example, 0-10% of the value (e.g., ±1%, ±2%, or ±10% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc., and in doing that may cause actuators or other devices to interact with the physical world.

Before describing such embodiments in more detail, however, it is instructive to present an example environment in which embodiments of the present disclosure may be implemented.

Exemplary Lithographic System

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV radiation beam B before the EUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL), or any other radiation source that is capable of generating EUV radiation.

Exemplary Apparatuses

Epoxy adhesives are a type of structural adhesive, and can be used to bond metals, glasses, ceramics, magnets, plastics, and other materials. Alternatively, fasteners (e.g., clamps, bolts, springs, etc.) can be used to fasten metals, glasses, ceramics, magnetics, plastics, and other materials. The joining together of pieces of material is an operation used by manufacturing processes, including lithographic processes. The use of epoxies or fasteners to attach together components in lithographic and semiconductor manufacturing processes can be used for specific components.

Current methods to bond components with epoxy or other adhesives, for example, a metal layer and a ceramic layer (e.g., glass), introduces thermal stress and strain between the layers due to a difference in coefficient of thermal expansion (CTE). CTE is a material property that characterizes how the size (e.g., volume, area, length) changes as a function of temperature. The choice of CTE depends on the particular application. Generally, the difference in CTEs of two joined pieces is proportional to the thermal stress or strain between the pieces.

Further, current methods to attach components without epoxy or other adhesives and instead using fasteners (e.g., clamps, bolts, nuts, springs, etc.) can cause breakage or cracks in one or both of the layers joined. Moreover, stress concentrations can occur due to imperfections between the adjoining surfaces. Furthermore, thermal stress or strain between the layers can still exist due to a difference in CTE.

Figure 2:
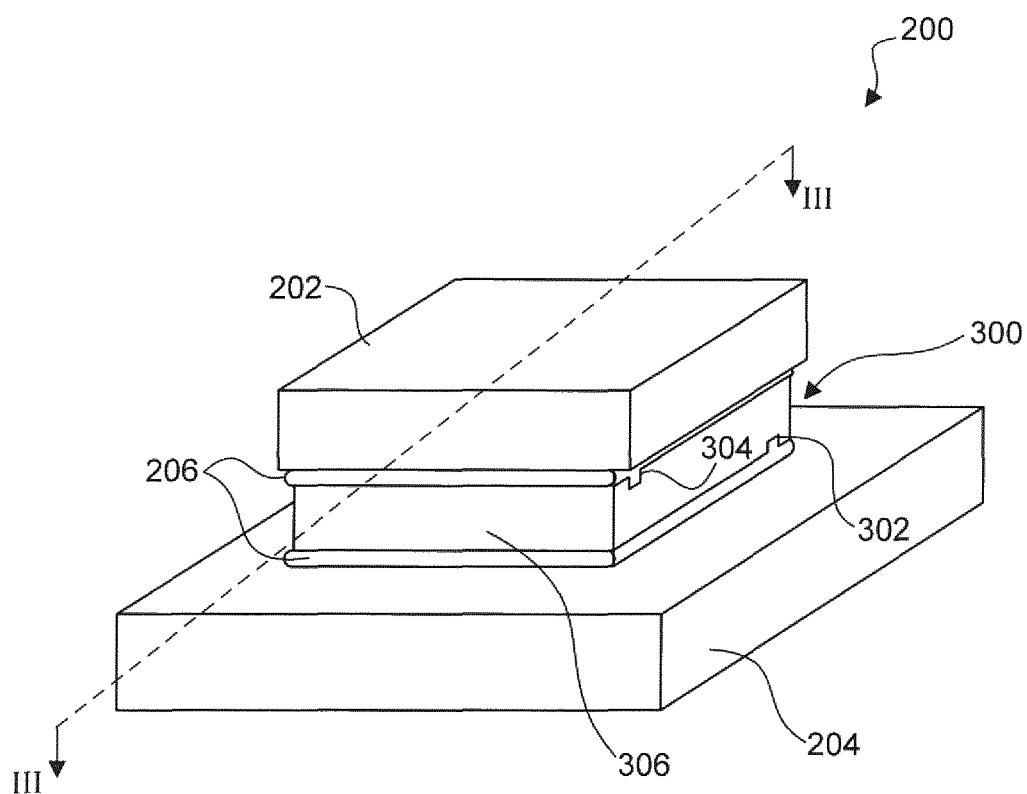
FIG. 2 is a perspective schematic illustration of an apparatus in a bonded configuration, according to an exemplary embodiment.
Figure 3:
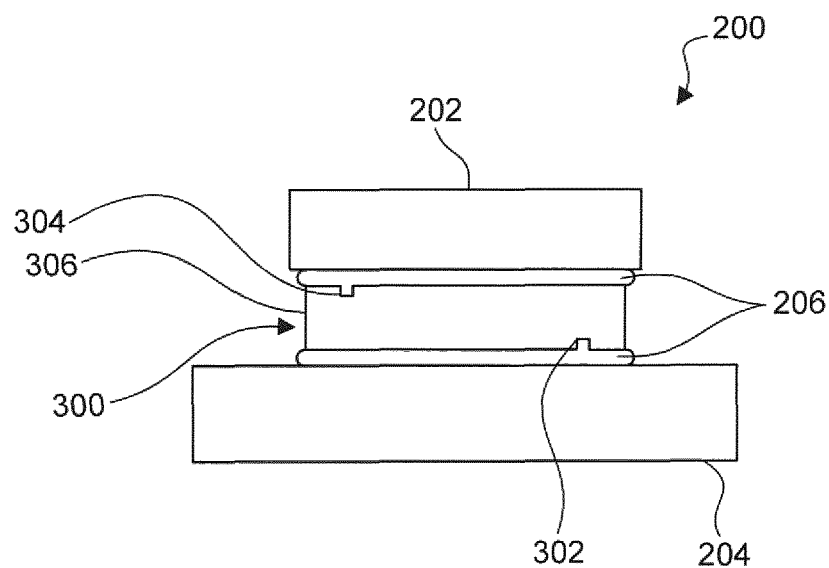
FIG. 3 is a cross-sectional schematic view of the apparatus of FIG. 2.

FIGS. 2 and 3 show schematic illustrations of an exemplary bonded apparatus 200, according to some embodiments of this disclosure. Bonded apparatus 200 can include first substrate 202, second substrate 204, bonding layer 206, and intermediate apparatus 300. In some embodiments, bonded apparatus 200 can be implemented in lithographic apparatus LA. For example, bonded apparatus 200 can be used to bond a motor for support structure MT in lithographic apparatus LA.

First substrate 202 can be any shape or size and any material. For example, first substrate 202 can be a magnet for support structure MT in lithographic apparatus LA. In some embodiments, first substrate 202 can be a metal, an insulator, a ceramic, a magnetic material, a glass, an optic, or any other suitable material that can be bonded by epoxy or adhesive. Second substrate 204 can be any shape or size and any material. For example, second substrate 204 can be a glass optic for illumination system IL in lithographic apparatus LA. In some embodiments, second substrate 204 can be a metal, an insulator, a ceramic, a magnetic material, a glass, an optic, or any other suitable material that can be bonded by epoxy or adhesive. In some embodiments, first substrate 202 can be a metal while second substrate 204 can be a ceramic (e.g., glass, ZERODUR®, etc.). In some embodiments, second substrate 204 can be a metal while first substrate 202 can be a ceramic (e.g., glass, ZERODUR®, etc.). In some embodiments, first and second substrates 202, 204 can be the same material, for example, a metal or a glass.

As shown in FIGS. 2 and 3, bonding layer 206 can be disposed between first substrate 202 and second substrate 204. In some embodiments, bonding layer 206 can be configured to bond first and second substrates 202, 204 together. As shown in FIGS. 2 and 3, bonded apparatus 200 can be in a bonded configuration, such that first and second substrates 202, 204 are bonded together by bonding layer 206. In some embodiments, bonding layer 206 can extend between first and second substrates 202, 204 around intermediate apparatus 300. In some embodiments, bonding layer 206 is an epoxy, elastomer, or thermoplastic. For example, bonding layer 206 can be a thermally cured epoxy.

Intermediate apparatus 300 can be disposed between first and second substrates 202, 204. Intermediate apparatus 300 contacts bonding layer 206. In some embodiments, intermediate apparatus 300 can be integral with bonding layer 206. For example, intermediate apparatus 300 can be embedded in bonding layer 206. Intermediate apparatus 300 is configured to be a first point of failure or breakage of bonded apparatus 200 under an applied force. Intermediate apparatus 300 can act as a sacrificial apparatus or sacrificial layer in order to protect first and second substrates 202, 204 and reduce breakage and thermal stress in bonded apparatus 200. As a force or stress is applied to bonded apparatus 200, intermediate apparatus 300 will break, fracture, or flex at a threshold force prior to breakage or fracture of first and/or second substrates 202, 204 in order to absorb the energy of the applied force or stress. For example, intermediate apparatus 300 will break, fracture, or flex at a threshold force of about 15 N, while first and second substrates 202, 204 are stable up to a threshold force of about 40 N.

As shown in FIGS. 2 and 3, intermediate apparatus 300 can include intermediate layer 306. Intermediate layer 306 can be any suitable shape or size and any material to help bond or debond first and second substrates 202, 204. In some embodiments, intermediate layer 306 can be a thin quadrilateral or cuboid. In some embodiments, intermediate layer 306 can be a thin disk or cylinder. In some embodiments, intermediate layer 306 can be an insulator, for example, a plastic. In some embodiments, intermediate layer 306 can be a metal, for example, aluminum. In some embodiments, intermediate layer 306 can be configured to set or control a predetermined bond line thickness of bonding layer 206. For example, intermediate layer 306 can have a substantially uniform thickness (height) in order to form a substantially uniform bonding layer 206 thickness, for example, about 200 nm to about 5 mm between first and second substrates 202, 204. In some embodiments, intermediate layer 306 can be configured to ventilate bonding layer 206. For example, as shown in FIGS. 2 and 3, intermediate layer 306 can include first groove 302 and second groove 304, each extending along one or more surfaces of intermediate layer 306, to help ventilate and evenly flow bonding layer 206 between intermediate apparatus 300 and first and second substrates 202, 204.

In some embodiments, intermediate layer 306 can include a ceramic. For example, intermediate layer 306 can include a glass or a tempered glass, for example, ZERODUR®. In some embodiments, intermediate layer 306 can include a polymer. For example, intermediate layer 306 can include plastics, fluoropolymers, polytetrafluoroethylene (e.g., TEFLON®), perfluoroelastomers (e.g., KALREZ®), polyether ether ketone, polyaryletherketone, polyetherimides (e.g., DURATON®), thermoplastics, or any combination thereof. In some embodiments, intermediate layer 306 can include a metal. For example, intermediate layer 306 can include aluminum, copper (e.g., oxygen-free high thermal conductivity), indium, magnesium, magnesium alloy (e.g., AZ80A-T5), molybdenum, steel, steel alloy (e.g., STAVAX®), gold, silver, nickel, or any combination thereof. In some embodiments, intermediate layer 306 can include a coating. For example, the coating can be a single or multi-layer and can include a ceramic, a polymer, a metal, or any combination thereof.

In some embodiments, intermediate layer 306 can include a stiffness substantially equivalent to that of second substrate 204. Stiffness is a material property defined as the resistance to deformation offered by an elastic body in response to an applied force. For example, intermediate layer 306 and second substrate 204 can both include a high stiffness material, for example, a stiffness greater than 1 MN/m. In some embodiments, intermediate layer 306 can have a lower elastic modulus (E) to that of second substrate 204. Elastic modulus or modulus of elasticity is a material property defined as the resistance to elastic (i.e., non-permanent) deformation offered by an elastic body in response to an applied force. A stiffer material will have a higher elastic modulus. For example, second substrate 204 can include an elastic modulus of about 65 GPa, while intermediate layer 306 can include a lower elastic modulus of about 10 GPa.

In some embodiments, intermediate layer 306 can include a compression strength substantially equivalent to that of second substrate 204. Compression strength is a material property defined as the maximum compression stress (i.e., reduction in size), which is produced normal to the cross-sectional area of the material, that the material can withstand before fracture (i.e., breakage) or irreversible deformation. For example, intermediate layer 306 and second substrate 204 can both include a high compression strength material, for example, a compression strength greater than 1 MPa.

In some embodiments, intermediate layer 306 can have a lower ultimate tensile strength (UTS) to that of second substrate 204. UTS is a material property defined as the maximum extension stress (i.e., elongation in size), which is produced normal to the cross-sectional area of the material, that the material can withstand before fracture (i.e., breakage) or irreversible deformation. For example, second substrate 204 can include a UTS of about 65 MPa, while intermediate layer 306 can include a lower UTS of about 10 MPa.

In some embodiments, intermediate layer 306 can have a lower yield strength (YS) to that of second substrate 204. Yield strength is a material property defined as the stress (i.e., reduction or elongation in size), which is produced normal to the cross-sectional area of the material, at which the material begins to deform plastically. For example, second substrate 204 can include a yield strength of about 65 MPa, while intermediate layer 306 can include a lower yield strength of about 10 MPa.

In some embodiments, intermediate layer 306 can include a CTE substantially equivalent to that of second substrate 204. For example, intermediate layer 306 and second substrate 204 can both include a low CTE material or ultra-low expansion (ULE) material. In some embodiments, intermediate layer 306 can include a low CTE material or ULE material. For example, intermediate layer 306 can include ZERODUR®, a tempered ceramic, or a plastic, with a cross-sectional thickness of about 200 nm to about 5 mm. In some embodiments, intermediate layer 306 can include a zero CTE or substantially zero CTE ceramic.

In some embodiments, intermediate layer 306 can have a lower cross-sectional area to that of second substrate 204. For example, second substrate 204 can include a cross-sectional area of about 100 mm$^2$, while intermediate layer 306 can include a lower cross-sectional area of about 1 mm$^2$ to about 50 mm$^2$.

In some embodiments, intermediate layer 306 can have a higher surface roughness to that of second substrate 204. Generally, the surface roughness of a ceramic material is inversely proportional to the breakage stress (e.g., compression strength, UTS) such that an increase in surface roughness decreases the breakage stress due to an increase in crack propagation sites. For example, intermediate layer 306 can include an average surface roughness of about 100 nm, while second substrate 204 can include an average surface roughness of about 10 nm.

In some embodiments, bonded apparatus 200 can undergo various manufacturing and/or processing stresses and strains (e.g., from heat, pressure, applied force, etc.) in order to improve the yield of bonded apparatus 200. For example, second substrate 204 can be subjected to elevated temperatures (e.g., from about 50° C. to about 250° C.) to improve yield (i.e., second substrate 204 is discarded, modified, or repaired if it fails (e.g., breaks, cracks, etc.) after being subjected to the elevated temperatures). In some embodiments, intermediate apparatus 300 can undergo various manufacturing and/or processing stresses and strains (e.g., from heat, pressure, applied force, etc.) in order to improve the yield of intermediate apparatus 300. For example, intermediate layer 306 can be subjected to elevated temperatures (e.g., from about 50° C. to about 250° C.) to improve yield (i.e., intermediate layer 306 is discarded, modified, or repaired if it fails (e.g., breaks, cracks, etc.) after being subjected to the elevated temperatures).

Figure 4:
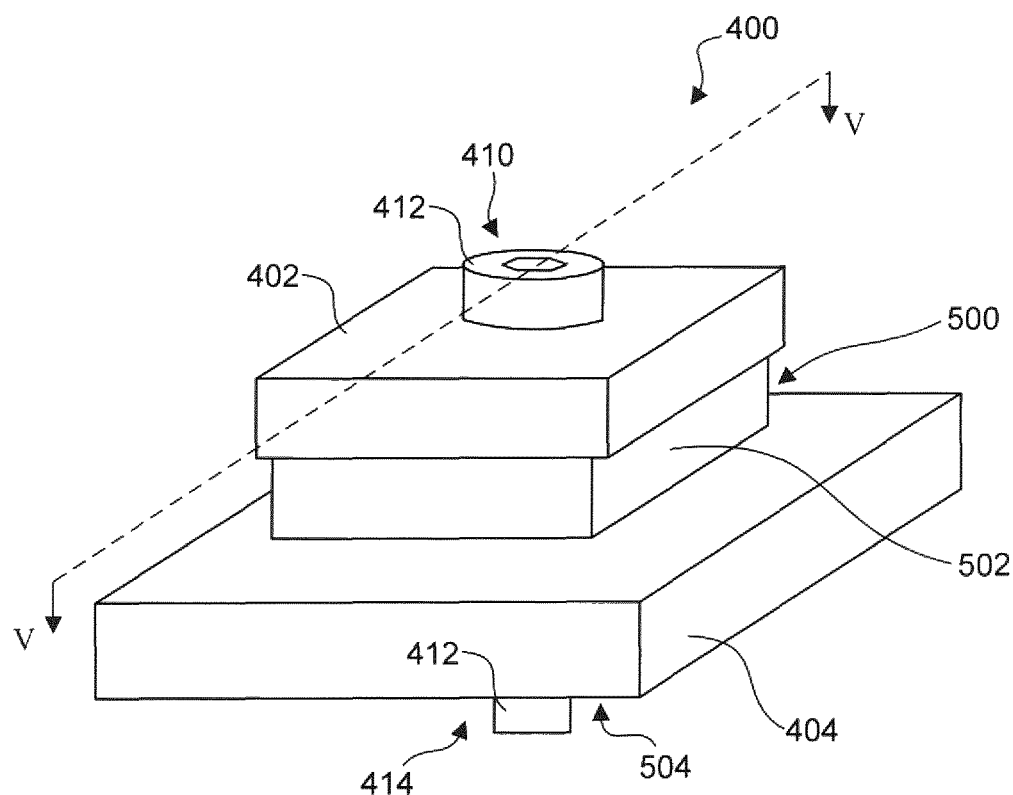
FIG. 4 is a perspective schematic illustration of an apparatus in a fastened configuration, according to an exemplary embodiment.
Figure 5:
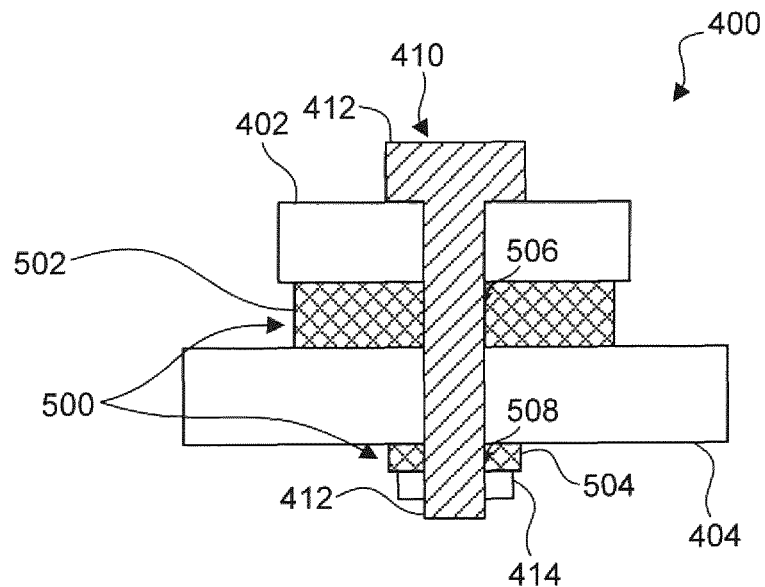
FIG. 5 is a cross-sectional schematic view of the apparatus of FIG. 4.

FIGS. 4 and 5 show schematic illustrations of an exemplary fastened apparatus 400, according to some embodiments of this disclosure. Fastened apparatus 400 is similar to bonded apparatus 200 shown in FIGS. 2 and 3, except fastened apparatus does not include any bonding layer and rather relies on a fastener to adhere first and second substrates together. Fastened apparatus 400 can include first substrate 402, second substrate 404, fastening apparatus 410, and intermediate apparatus 500. In some embodiments, fastened apparatus 400 can be implemented in lithographic apparatus LA. For example, fastened apparatus 400 can be used to attach a motor for support structure MT in lithographic apparatus LA.

First substrate 402 can be any shape or size and any material. For example, first substrate 402 can be a magnet for support structure MT in lithographic apparatus LA. In some embodiments, first substrate 402 can be a metal, an insulator, a ceramic, a magnetic material, a glass, an optic, or any other suitable material that can be fastened by a fastener (e.g., bolt, clamp, nut, spring, etc.). Second substrate 404 can be any shape or size and any material. For example, second substrate 404 can be a glass optic for illumination system IL in lithographic apparatus LA. In some embodiments, second substrate 404 can be a metal, an insulator, a ceramic, a magnetic material, a glass, an optic, or any other suitable material that can be fastened by a fastener. In some embodiments, first substrate 402 can be a metal while second substrate 404 can be a ceramic (e.g., glass, ZERODUR®, etc.). In some embodiments, second substrate 404 can be a metal while first substrate 402 can be a ceramic (e.g., glass, ZERODUR®, etc.). In some embodiments, first and second substrates 402, 404 can be the same material, for example, a metal or a glass.

As shown in FIGS. 4 and 5, fastening apparatus 410 can be coupled to first substrate 402 and second substrate 404. Fastening apparatus 410 can be configured to secure intermediate apparatus 500 to first and second substrates 402, 404 and secure first and second substrates 402, 404 relative to the other. Fastening apparatus 410 can include a fastener (e.g., bolt, nut, clamp, spring, etc.). For example, as shown in FIG. 5, fastening apparatus 410 can include bolt 412 and corresponding nut 414. In some embodiments, fastening apparatus 410 can be configured to attach first and second substrates 402, 404 together. As shown in FIGS. 4 and 5, fastened apparatus 400 can be in a fastened configuration, such that first and second substrates 402, 404 are fastened together by fastening apparatus 410. In some embodiments, fastening apparatus 410 can extend between first and second substrates 402, 404 around or through intermediate apparatus 500. In some embodiments, fastening apparatus 410 can include a ceramic, a polymer, a metal, or any combination thereof.

Intermediate apparatus 500 can be disposed between fastening apparatus 410. In some embodiments, intermediate apparatus 500 can include one or more intermediate layers. For example, as shown in FIG. 5, intermediate apparatus 500 can include first intermediate layer 502 and second intermediate layer 504. First intermediate layer 502 can be disposed between first and second substrates 402, 404. Second intermediate layer 504 can be disposed between first substrate 402 and fastening apparatus 410 or second substrate 404 and fastening apparatus 410. Intermediate apparatus 500 contacts fastening apparatus 410 and first and second substrates 402, 404. In some embodiments, intermediate apparatus 500 can include one or more apertures or vias. For example, as shown in FIG. 5, intermediate apparatus 500 can include first intermediate layer 502 with first aperture 506 and second intermediate layer 504 with second aperture 508. First and second apertures 506, 508 can be configured to pass fastening apparatus 410, for example, bolt 412, through intermediate apparatus 500 to secure first and second intermediate layers 502, 504 to first and second substrates 402, 404.

Intermediate apparatus 500 is configured to be a first point of failure or breakage of fastened apparatus 400 under an applied force. Intermediate apparatus 500 can act as a sacrificial apparatus or sacrificial layer in order to protect first and second substrates 402, 404 and reduce breakage and thermal stress in fastened apparatus 400. As a force or stress is applied to fastened apparatus 400, intermediate apparatus 500 will break, fracture, or flex at a threshold force prior to breakage or fracture of first and/or second substrates 402, 404 in order to absorb the energy of the applied force or stress. For example, intermediate apparatus 500 will break, fracture, or flex at a threshold force of about 15 N, while first and second substrates 402, 404 are stable up to a threshold force of about 40 N.

As shown in FIGS. 4 and 5, intermediate apparatus 500 can include first and second intermediate layers 502, 504. First and second intermediate layers 502, 504 can be any suitable shape or size and any material to help attach or secure first and second substrates 402, 404 together. In some embodiments, first and second intermediate layers 502, 504 can be the same. In some embodiments, first and second intermediate layers 502, 504 can be different. In some embodiments, first and second intermediate layers 502, 504 can be a thin quadrilateral or cuboid. In some embodiments, first and second intermediate layers 502, 504 can be a thin disk or cylinder. In some embodiments, first and second intermediate layers 502, 504 can be an insulator, for example, a plastic. In some embodiments, first and second intermediate layers 502, 504 can be a metal, for example, aluminum. In some embodiments, first and second intermediate layers 502, 504 can be configured to set or control a predetermined thickness of fastened apparatus 400. For example, first and second intermediate layers 502, 504 can have a substantially uniform thickness (height) in order to form a substantially uniform fastened apparatus 400 thickness, for example, about 200 nm to about 5 mm between first and second substrates 402, 404.

In some embodiments, first and second intermediate layers 502, 504 can include a ceramic. For example, first and second intermediate layers 502, 504 can include a glass or a tempered glass, for example, ZERODUR®. In some embodiments, first and second intermediate layers 502, 504 can include a polymer. For example, first and second intermediate layers 502, 504 can include plastics, fluoropolymers, polytetrafluoroethylene (e.g., TEFLON®), perfluoroelastomers (e.g., KALREZ®), polyether ether ketone, polyaryletherketone, polyetherimides (e.g., DURATON®), thermoplastics, or any combination thereof. In some embodiments, first and second intermediate layers 502, 504 can include a metal. For example, first and second intermediate layers 502, 504 can include aluminum, copper (e.g., oxygen-free high thermal conductivity), indium, magnesium, magnesium alloy (e.g., AZ80A-T5), molybdenum, steel, steel alloy (e.g., STAVAX®), gold, silver, nickel, or any combination thereof. In some embodiments, first and second intermediate layers 502, 504 can include a coating. For example, the coating can be a single or multi-layer and can include a ceramic, a polymer, a metal, or any combination thereof. In some embodiments, first intermediate layer 502 can be a coating on first substrate 402 or second substrate 404. For example, as shown in FIG. 5, first intermediate layer 502 can be a coating on first substrate 402. In some embodiments, first intermediate layer 502 can be a coating on fastening apparatus 410. In some embodiments, second intermediate layer 504 can be a coating on first substrate 402 or second substrate 404. For example, as shown in FIG. 5, second intermediate layer 504 can be a coating on second substrate 404. In some embodiments, second intermediate layer 504 can be a coating on fastening apparatus 410. For example, as shown in FIG. 5, second intermediate layer 504 can be a coating on nut 414.

In some embodiments, first and second intermediate layers 502, 504 can include a stiffness substantially equivalent to that of second substrate 404. For example, first and second intermediate layers 502, 504 and second substrate 404 can both include a high stiffness material, for example, a stiffness greater than 1 MN/m. In some embodiments, first and second intermediate layers 502, 504 can have a lower elastic modulus (E) to that of second substrate 404. For example, second substrate 404 can include an elastic modulus of about 65 GPa, while first and second intermediate layers 502, 504 can include a lower elastic modulus of about 10 GPa.

In some embodiments, first and second intermediate layers 502, 504 can include a compression strength substantially equivalent to that of second substrate 404. For example, first and second intermediate layers 502, 504 and second substrate 404 can both include a high compression strength material, for example, a compression strength greater than 1 MPa. In some embodiments, first and second intermediate layers 502, 504 can have a lower ultimate tensile strength (UTS) to that of second substrate 404. For example, second substrate 404 can include a UTS of about 65 MPa, while first and second intermediate layers 502, 504 can include a lower UTS of about 10 MPa. In some embodiments, first and second intermediate layers 502, 504 can have a lower yield strength (YS) to that of second substrate 404. For example, second substrate 404 can include a yield strength of about 65 MPa, while first and second intermediate layers 502, 504 can include a lower yield strength of about 10 MPa.

In some embodiments, first and second intermediate layers 502, 504 can include a CTE substantially equivalent to that of second substrate 404. For example, first and second intermediate layers 502, 504 and second substrate 404 can both include a low CTE material or ULE material. In some embodiments, first and second intermediate layers 502, 504 can include a low CTE material or ULE material. For example, first and second intermediate layers 502, 504 can include ZERODUR®, a tempered ceramic, or a plastic, with a cross-sectional thickness of about 200 nm to about 5 mm. In some embodiments, first and second intermediate layers 502, 504 can include a zero CTE or substantially zero CTE ceramic.

In some embodiments, first and second intermediate layers 502, 504 can have a lower cross-sectional area to that of second substrate 404. For example, second substrate 404 can include a cross-sectional area of about 100 mm$^2$, while first and second intermediate layers 502, 504 can include a lower cross-sectional area of about 1 mm$^2$ to about 50 mm$^2$. In some embodiments, first and second intermediate layers 502, 504 can have a higher surface roughness to that of second substrate 404. For example, first and second intermediate layers 502, 504 can include an average surface roughness of about 100 nm, while second substrate 404 can include an average surface roughness of about 10 nm.

In some embodiments, fastened apparatus 400 can undergo various manufacturing and/or processing stresses and strains (e.g., from heat, pressure, applied force, etc.) in order to improve the yield of fastened apparatus 400. For example, second substrate 404 can be subjected to elevated temperatures (e.g., from about 50° C. to about 250° C.) to improve yield (i.e., second substrate 404 is discarded, modified, or repaired if it fails (e.g., breaks, cracks, etc.) after being subjected to the elevated temperatures). In some embodiments, intermediate apparatus 500 can undergo various manufacturing and/or processing stresses and strains (e.g., from heat, pressure, applied force, etc.) in order to improve the yield of intermediate apparatus 500. For example, first and second intermediate layers 502, 504 can be subjected to elevated temperatures (e.g., from about 50° C. to about 250° C.) to improve yield (i.e., first intermediate layer 502 and/or second intermediate layer 504 is discarded, modified, or repaired if it fails (e.g., breaks, cracks, etc.) after being subjected to the elevated temperatures).

Exemplary Reticle Stage

Figure 6:
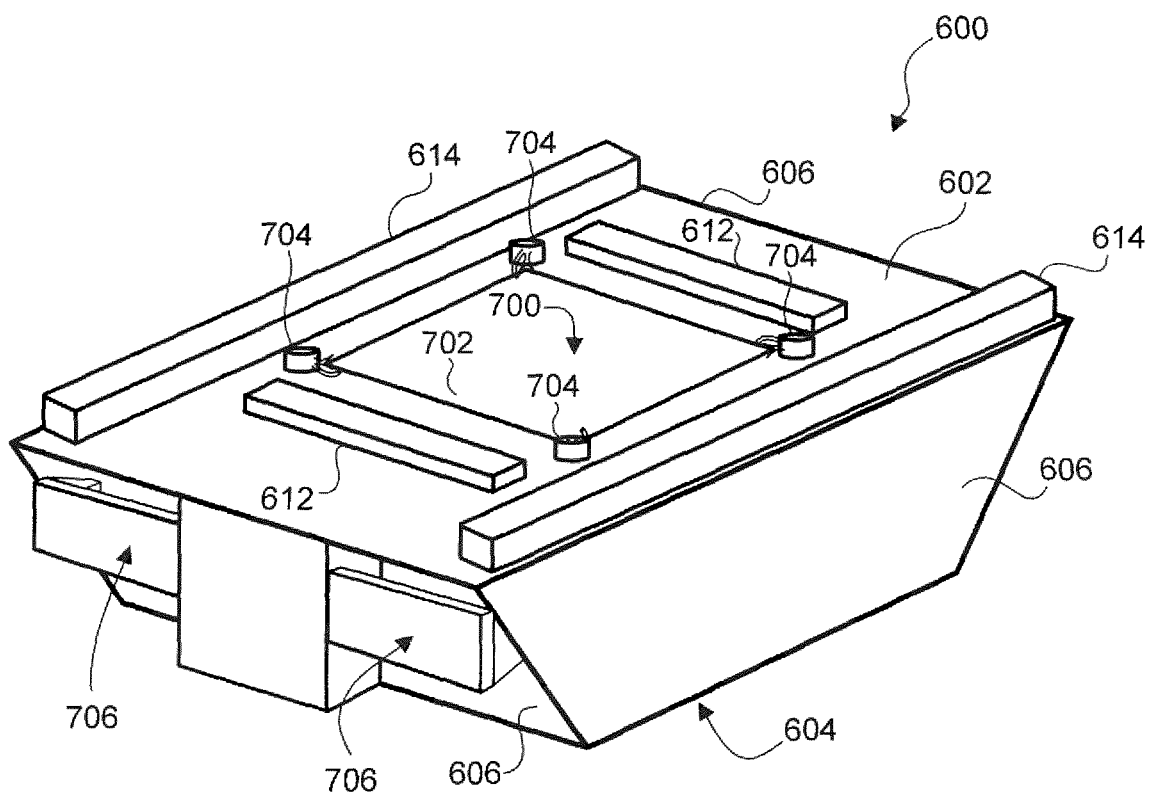
FIG. 6 is a bottom perspective schematic illustration of a reticle stage, according to an exemplary embodiment.

FIGS. 6 through 9 show schematic illustrations of an exemplary reticle stage 600, according to some embodiments of this disclosure. Reticle stage 600 can include bottom stage surface 602, top stage surface 604, side stage surfaces 606, clamp 700, reticle cage 704, magnetic actuator (Y-direction) 706, magnetic actuator (Z-direction) 708, and connector 710. In some embodiments, reticle stage 600 with clamp 700 can be implemented in lithographic apparatus LA. For example, reticle stage 600 can be support structure MT in lithographic apparatus LA. In some embodiments, clamp 700 can be disposed on bottom stage surface 602. For example, as shown in FIG. 6, clamp 700 can be disposed at a center of bottom stage surface 602 with clamp frontside 702 facing perpendicularly away from bottom stage surface 602. In some embodiments, reticle cage 704 can be disposed on bottom stage surface 602. For example, as shown in FIG. 6, clamp 700 (e.g., electrostatic clamp for a reticle (not shown)) can be disposed at a center of bottom stage surface 602 with reticle cages 704 disposed adjacent to each corner of clamp 700.

In some lithographic apparatuses, for example, lithographic apparatus LA, a reticle stage 600 with a clamp 700 can be used to hold and position a reticle (not shown) for scanning or patterning operations. In one example, the reticle stage 600 may require powerful drives, large balance masses, and heavy frames to support it. In one example, the reticle stage 600 may have a large inertia and can weigh over 500 kg to propel and position a reticle (not shown) weighing about 0.5 kg. To accomplish reciprocating motions of the reticle (not shown), which are typically found in lithographic scanning or patterning operations, accelerating and decelerating forces can be provided by linear motors that drive the reticle stage 600.

Figure 7:
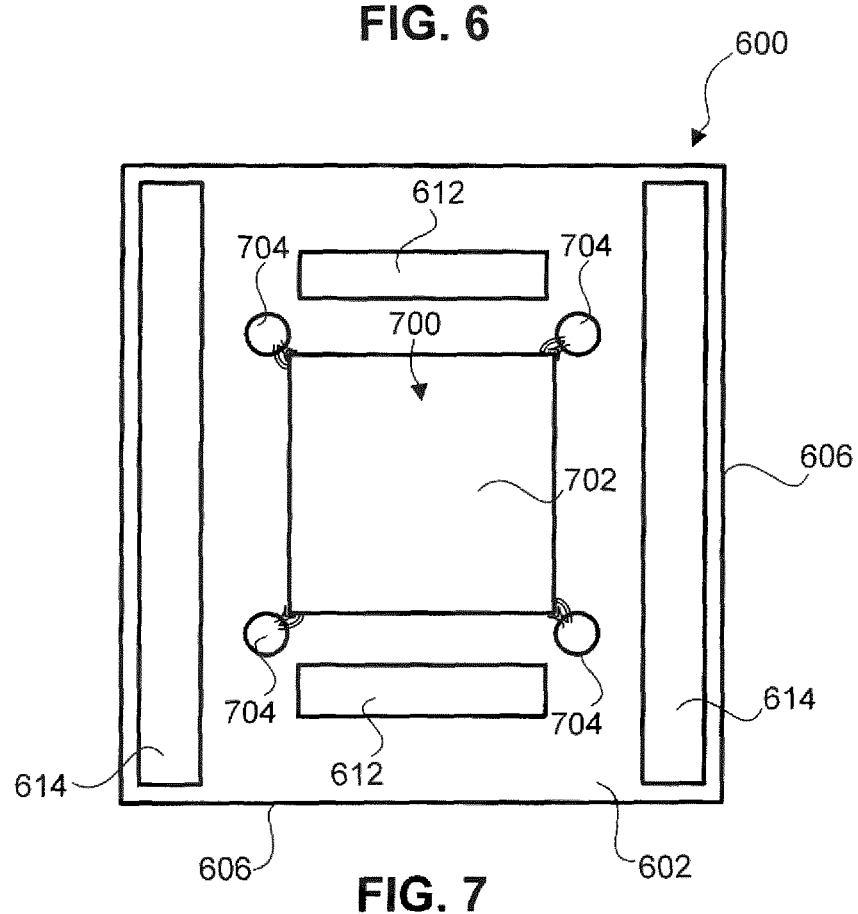
FIG. 7 is a bottom plan schematic view of the reticle stage of FIG. 6.

In some embodiments, as shown in FIGS. 6 and 7, reticle stage 600 can include first encoder 612 and second encoder 614 for positioning operations. For example, first and second encoders 612, 614 can be interferometers. First encoder 612 can be attached along a first direction, for example, a transverse direction (i.e., X-direction) of reticle stage 600. And second encoder 614 can be attached along a second direction, for example, a longitudinal direction (i.e., Y-direction) of reticle stage 600. In some embodiments, as shown in FIGS. 6 and 7, first encoder 612 can be orthogonal to second encoder 614.

As shown in FIGS. 6 and 7, reticle stage 600 can include clamp 700. Clamp 700 is configured to hold a reticle (not shown) in a fixed plane on reticle stage 600. Clamp 700 includes clamp frontside 702 and can be disposed on bottom stage surface 602. In some embodiments, clamp 700 can use mechanical, vacuum, electrostatic, or other suitable clamping techniques to hold and secure an object. In some embodiments, clamp 700 can be an electrostatic clamp, which can be configured to electrostatically clamp (i.e., hold) an object, for example, a reticle (not shown) in a vacuum environment. Due to the requirement to perform EUV in a vacuum environment, vacuum clamps cannot be used to clamp a mask or reticle and instead electrostatic clamps can be used. For example, clamp 700 can include an electrode, a resistive layer on the electrode, a dielectric layer on the resistive layer, and burls projecting from the dielectric layer. In use, a voltage can be applied to clamp 700, for example, several kV. And current can flow through the resistive layer, such that the voltage at an upper surface of the resistive layer will substantially be the same as the voltage of the electrode and generate an electric field. Also, a Coulomb force, attractive force between electrically opposite charged particles, will attract an object to clamp 700 and hold the object in place. In some embodiments, clamp 700 can be a rigid material, for example, a metal, a dielectric, a ceramic, or a combination thereof.

As shown in FIGS. 6 and 7, reticle stage 600 can include one or more reticle cages 704. Reticle cage 704 can be configured to secure and reduce damage to a reticle (not shown) secured by clamp 700, for example, during a crash. Reticle cage 704 can be configured to uniformly distribute an impact force of a reticle (not shown) during a crash. In some embodiments, a plurality of reticle cages 704 can be disposed in bottom stage surface 602 and arranged around a perimeter of a reticle (not shown). For example, multiple reticle cages 704 can be disposed adjacent each corner of clamp 700 to uniformly distribute an impact force of a reticle (not shown) over a plurality of impact locations.

Reticle cage 704 can include a body, a securing mechanism, a safety latch, and a bumper apparatus. Reticle cage 704 can be a rigid material, for example, a metal or a ceramic. In some embodiments, reticle cage 704 can extend through a portion of reticle stage 600. For example, reticle cage 704 can be cylindrical and extend through bottom stage surface 602 for rigid alignment with a corner of clamp 700. In some embodiments, reticle cage 704 can be secured to bottom stage surface 602 with one or more securing mechanisms. For example, a securing mechanism can be a bolt. In some embodiments, a safety latch can be configured to secure (i.e., catch) and reduce damage to a reticle (not shown) during a crash. For example, a safety latch can extend over a top surface of a reticle (not shown) and be configured to prevent movement in a direction perpendicular to bottom stage surface 602 (i.e., Z-direction).

Figure 8:
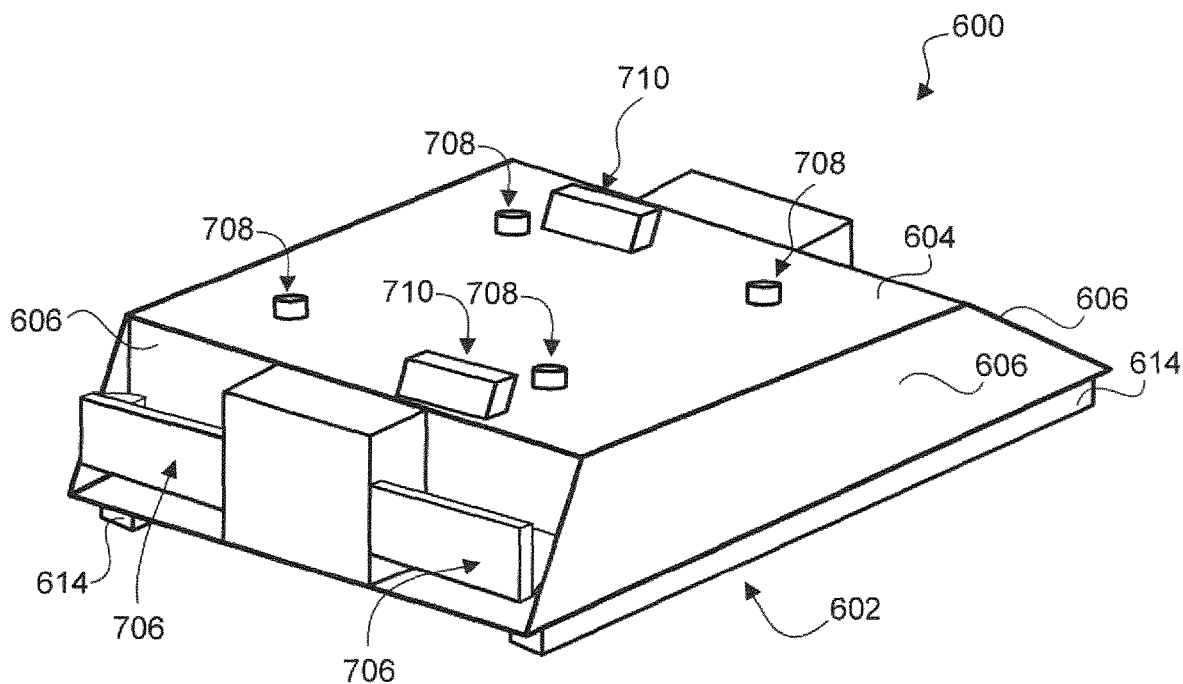
FIG. 8 is a top perspective schematic illustration of the reticle stage of FIG. 6.
Figure 9:
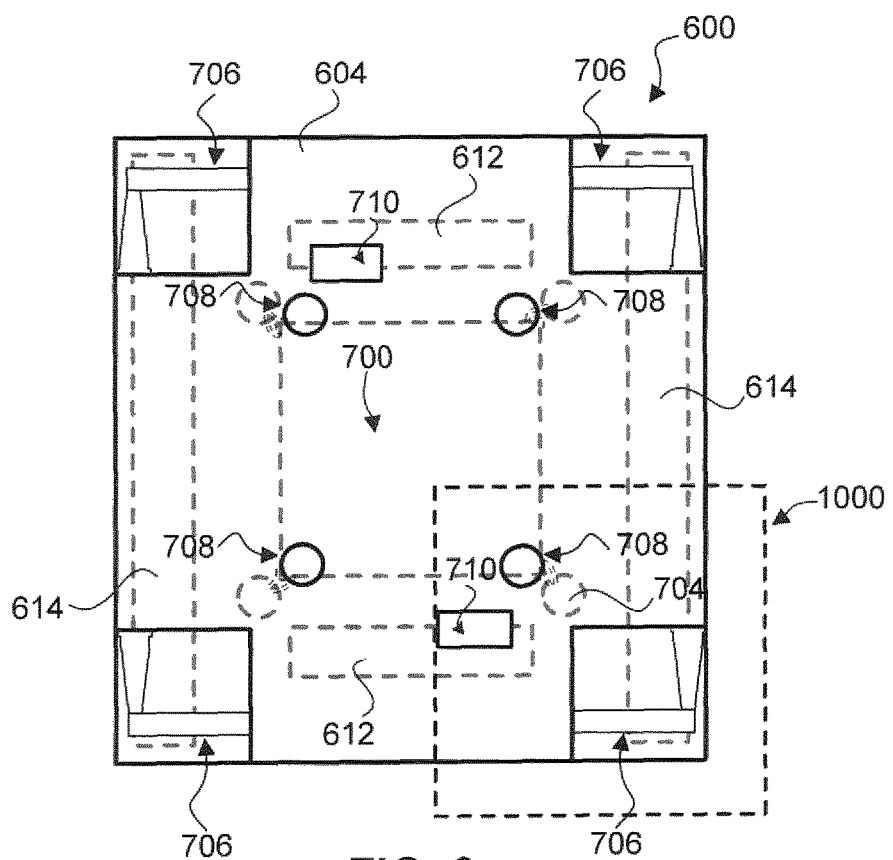
FIG. 9 is a top plan schematic view of the reticle stage of FIG. 6.

As shown in FIGS. 8 and 9, reticle stage 600 can include magnetic actuator (Y-direction) 706 and magnetic actuator (Z-direction) 708. As discussed above, accelerating and decelerating forces can be provided by linear motors, for example, magnetic actuator (Y-direction) 706 and magnetic actuator (Z-direction) 708, to drive reticle stage 600. In some embodiments, reticle stage 600 can include one or more magnetic actuators (Y-direction) 706. For example, as shown in FIG. 8, magnetic actuator (Y-direction) 706 can be disposed on side stage surfaces 606 along a longitudinal direction (i.e., Y-direction) of reticle stage 600, for example, parallel to second encoder 614 and can be configured to translate reticle stage 600 along the longitudinal direction (i.e., Y-direction). In some embodiments, reticle stage 600 can include one or more magnetic actuators (Z-direction) 708. For example, as shown in FIG. 8, magnetic actuator (Z-direction) 708 can be disposed on top stage surface 604 and can be configured to translate reticle stage 600 along a depth direction (i.e., Z-direction) of reticle stage 600, for example, perpendicular to top stage surface 604 (i.e., Z-direction).

As shown in FIGS. 8 and 9, reticle stage 600 can include connector 710. In some embodiments, reticle stage 600 can include one or more connectors 710. For example, as shown in FIG. 8, connector 710 can be disposed on top stage surface 604 and can be configured to connect gas or fluid lines (e.g., water) to reticle stage 600 for temperature and/or pressure control.

In some embodiments, reticle stage 600 can undergo various manufacturing and/or processing stresses and strains (e.g., from heat, pressure, applied force, etc.) in order to improve the yield of reticle stage 600. For example, reticle stage 600 can be subjected to elevated temperatures (e.g., from about 50° C. to about 250° C.) to improve yield (i.e., reticle stage 600 is discarded, modified, or repaired if it fails (e.g., breaks, cracks, etc.) after being subjected to the elevated temperatures).

Exemplary Apparatuses on Reticle Stage

Figure 10:
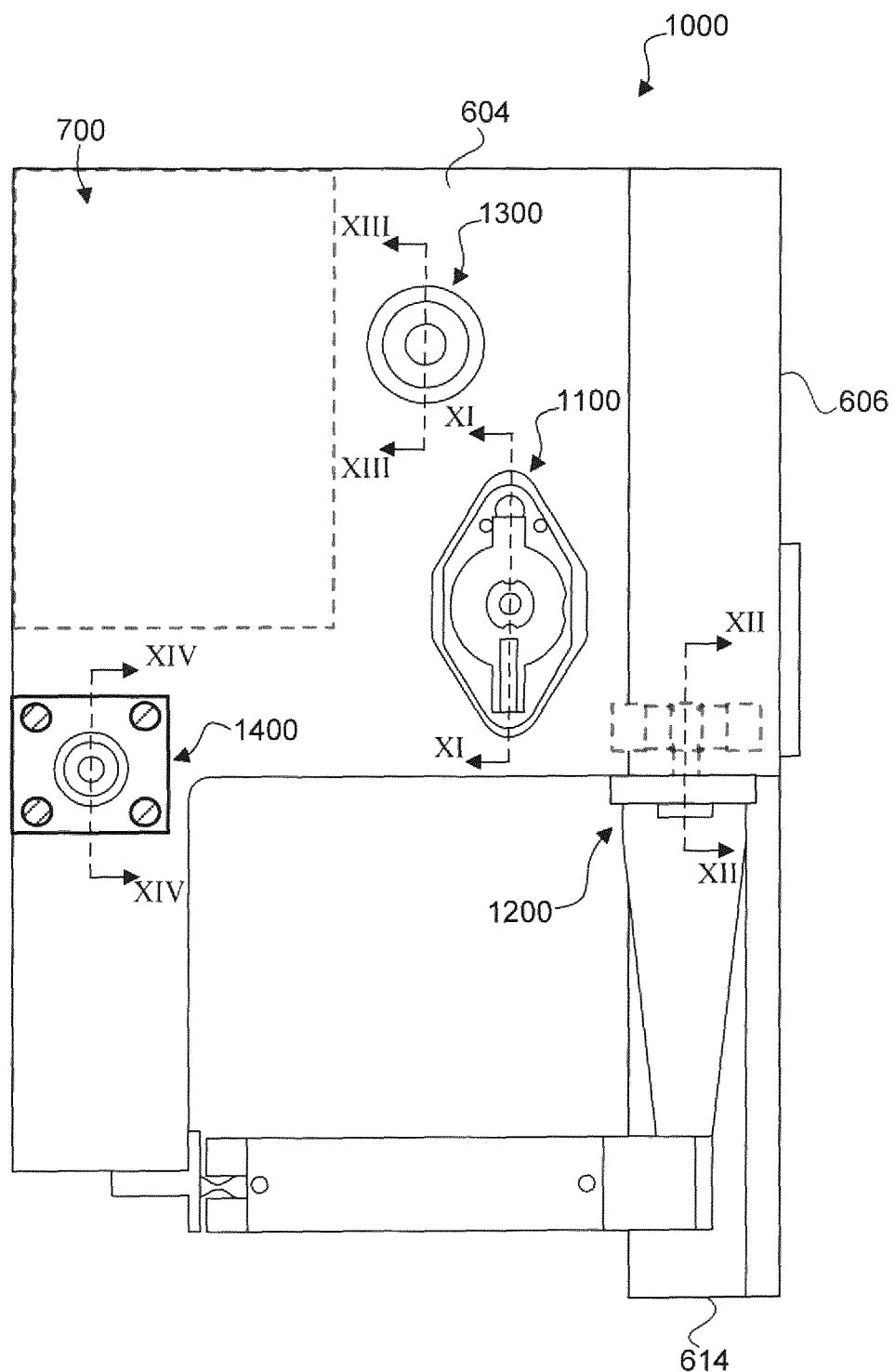
FIG. 10 is an enlarged top plan schematic view of an exemplary reticle stage, according to exemplary embodiments.

FIGS. 10 through 14 show schematic illustrations of exemplary apparatuses of an exemplary reticle stage, according to some embodiments of this disclosure. FIG. 10 depicts a schematic enlarged bottom plan view of a region 1000 shown in FIG. 9 of reticle stage 600 including top stage surface 604, side stage surfaces 606, second encoder 614, clamp 700, reticle cage apparatus 1100 (i.e., reticle cage 704 as shown in FIG. 9), magnetic actuator (Y-direction) apparatus 1200 (i.e., magnetic actuator (Y-direction) as shown in FIG. 9), magnetic actuator (Z-direction) apparatus 1300 (i.e., magnetic actuator (Z-direction) 708 as shown in FIG. 9), and connector apparatus 1400 (i.e., connector 710 as shown in FIG. 9), according to some embodiments of the present disclosure.

As shown in FIG. 10, region 1000 of reticle stage 600 (i.e., region 1000 as shown in FIG. 9) can include top stage surface 604, side stage surfaces 606, second encoder 614, clamp 700, reticle cage apparatus 1100 (i.e., reticle cage 704 as shown in FIG. 9), magnetic actuator (Y-direction) apparatus 1200 (i.e., magnetic actuator (Y-direction) as shown in FIG. 9), magnetic actuator (Z-direction) apparatus 1300 (i.e., magnetic actuator (Z-direction) 708 as shown in FIG. 9), and connector apparatus 1400 (i.e., connector 710 as shown in FIG. 9).

Figure 11:
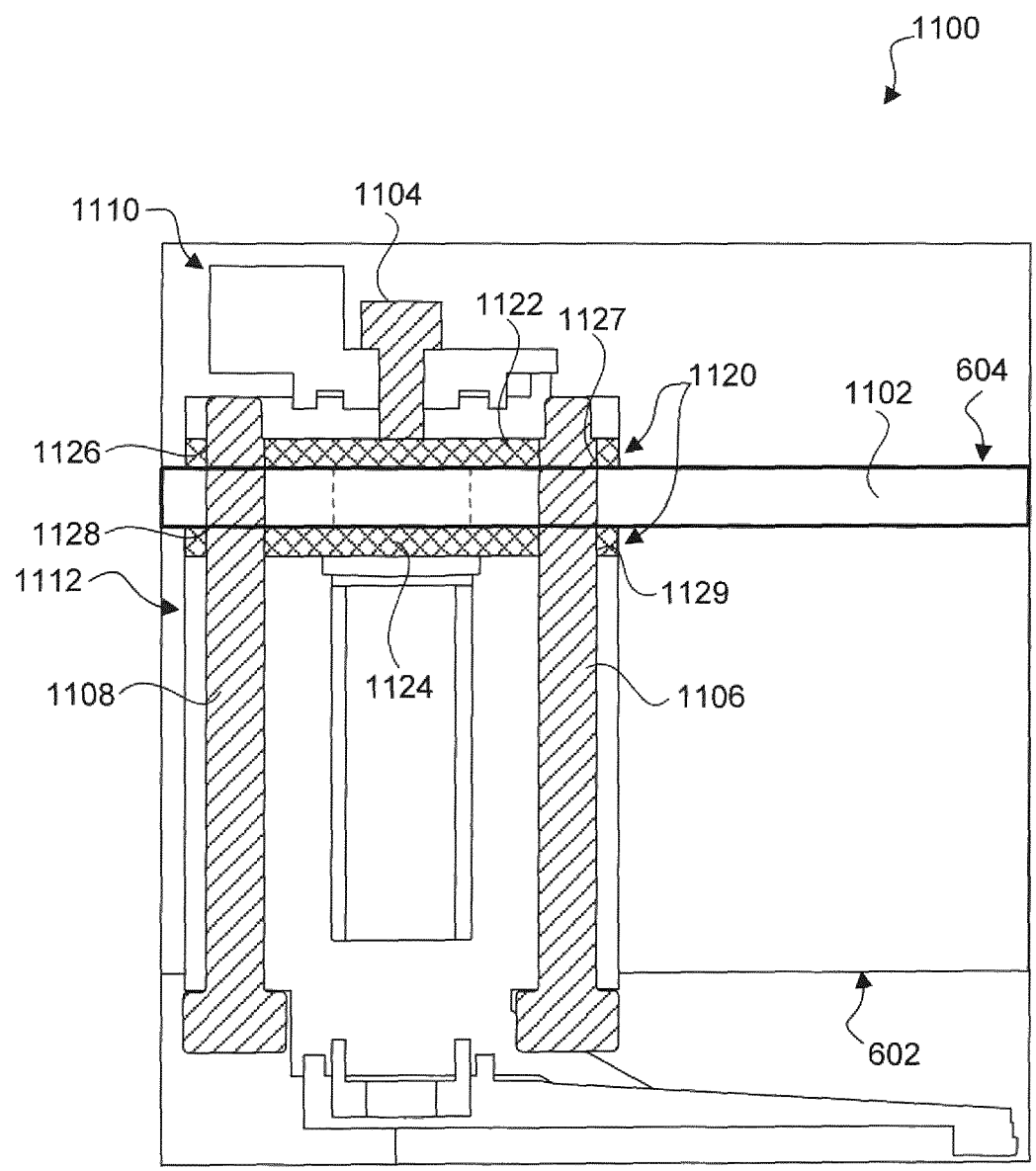
FIG. 11 is a cross-sectional schematic view of an exemplary apparatus, according to an exemplary embodiment.

FIG. 11 shows a cross-sectional schematic illustration of an exemplary reticle cage apparatus 1100, as indicated in FIG. 10, according to some embodiments of this disclosure.

Reticle cage apparatus 1100 is similar to bonded apparatus 200 shown in FIGS. 2 and 3 and fastened apparatus 400 shown in FIGS. 4 and 5. As shown in FIG. 11, reticle cage apparatus 1100 can be in a fastened configuration similar to that of fastened apparatus 400 shown in FIGS. 4 and 5. Alternatively, in some embodiments, reticle cage apparatus 1100 can be in a bonded configuration similar to that of bonded apparatus 200 shown in FIGS. 2 and 3. Reticle cage apparatus 1100 can include reticle stage portion 1102, first substrate 1110, second substrate 1112, first fastener 1104, second fastener 1106, third fastener 1108, and intermediate apparatus 1120. In some embodiments, reticle cage apparatus 1100 can be implemented in lithographic apparatus LA.

Reticle stage portion 1102 can be part of reticle stage 600 shown in FIGS. 6 through 9. As shown in FIG. 11, reticle stage portion 1102 can be disposed between bottom stage surface 602 and top stage surface 604. Reticle stage portion 1102 can be any shape or size and any material. For example, reticle stage portion 1102 can include a low CTE material or ULE material, for example, ZERODUR®. In some embodiments, reticle stage portion 1102 can include a zero CTE or substantially zero CTE ceramic. In some embodiments, reticle stage portion 1102 can be a metal, an insulator, a ceramic, a magnetic material, a glass, an optic, or any other suitable material.

First substrate 1110 can be any shape or size and any material. For example, first substrate 1110 can be a ceramic bottom cover for reticle cage 704. In some embodiments, first substrate 1110 can be a metal, an insulator, a ceramic, a magnetic material, a glass, an optic, or any other suitable material that can be fastened by a fastener (e.g., bolt, clamp, nut, spring, etc.). Second substrate 1112 can be any shape or size and any material. For example, second substrate 1112 can be a ceramic body for reticle cage 704. In some embodiments, second substrate 1112 can be a metal, an insulator, a ceramic, a magnetic material, a glass, an optic, or any other suitable material that can be fastened by a fastener. In some embodiments, first and second substrates 1110, 1112 can be a metal while reticle stage portion 1102 can be a ceramic (e.g., glass, ZERODUR®, etc.). In some embodiments, second substrate 1112 can be a metal while first substrate 1110 can be a ceramic (e.g., glass, ZERODUR®, etc.). In some embodiments, first and second substrates 1110, 1112 can be the same material, for example, a metal or a glass.

As shown in FIG. 11, first fastener 1104, second fastener 1106, and third fastener 1108 can be coupled to first substrate 1110, second substrate 1112, and reticle stage portion 1102. First fastener 1104, second fastener 1106, and third fastener 1108 can be configured to secure intermediate apparatus 1120 to first substrate 1110, second substrate 1112, and reticle stage portion 1102, and secure first and second substrates 1110, 1112 relative to the other. First fastener 1104, second fastener 1106, and third fastener 1108 can include a fastener (e.g., bolt, nut, clamp, spring, etc.). For example, as shown in FIG. 11, first fastener 1104, second fastener 1106, and third fastener 1108 can include a bolt. In some embodiments, first fastener 1104, second fastener 1106, and/or third fastener 1108 can be configured to attach reticle stage portion 1102 and first and second substrates 1110, 1112 together. As shown in FIG. 11, reticle cage apparatus 1100 can be in a fastened configuration, such that first and second substrates 1110, 1112 are fastened together to reticle stage portion 1102 by first fastener 1104, second fastener 1106, and/or third fastener 1108. In some embodiments, first fastener 1104, second fastener 1106, and/or third fastener 1108 can extend between reticle stage portion 1102 and first and second substrates 1110, 1112 around or through intermediate apparatus 1120. In some embodiments, first fastener 1104, second fastener 1106, and/or third fastener 1108 can include a ceramic, a polymer, a metal, or any combination thereof.

Intermediate apparatus 1120 can be disposed between first and second substrates 1110, 1112. In some embodiments, intermediate apparatus 1120 can include one or more intermediate layers. For example, as shown in FIG. 11, intermediate apparatus 1120 can include first intermediate layer 1122 and second intermediate layer 1124. First intermediate layer 1122 can be disposed between first substrate 1110 and reticle stage portion 1102. Second intermediate layer 1124 can be disposed between second substrate 1112 and reticle stage portion 1102. Intermediate apparatus 1120 contacts reticle stage portion 1102, first and second substrates 1110, 1112, first fastener 1104, second fastener 1106, and/or third fastener 1108. In some embodiments, intermediate apparatus 1120 can include one or more apertures or vias. For example, as shown in FIG. 11, intermediate apparatus 1120 can include first intermediate layer 1122 with first apertures 1126, 1127 and second intermediate layer 1124 with second apertures 1128, 1129. First and second apertures 1126, 1127, 1128, 1129 can be configured to pass second fastener 1106 and third fastener 1108, respectively, through intermediate apparatus 1120 to secure first and second intermediate layers 1122, 1124 to reticle stage portion 1102 and first and second substrates 1110, 1112.

Intermediate apparatus 1120 is configured to be a first point of failure or breakage of reticle cage apparatus 1100 under an applied force. Intermediate apparatus 1120 can act as a sacrificial apparatus or sacrificial layer in order to protect reticle stage portion 1102 and first and second substrates 1110, 1112, and reduce breakage and thermal stress in reticle cage apparatus 1100. As a force or stress is applied to reticle cage apparatus 1100, intermediate apparatus 1120 will break, fracture, or flex at a threshold force prior to breakage or fracture of reticle stage portion 1102 in order to absorb the energy of the applied force or stress. For example, intermediate apparatus 1120 will break, fracture, or flex at a threshold force of about 15 N, while reticle stage portion 1102 is stable up to a threshold force of about 40 N.

As shown in FIG. 11, intermediate apparatus 1120 can include first and second intermediate layers 1122, 1124. First and second intermediate layers 1122, 1124 can be any suitable shape or size and any material to help attach or secure reticle stage portion 1102 and first and second substrates 1110, 1112 together. In some embodiments, first and second intermediate layers 1122, 1124 can be the same. In some embodiments, first and second intermediate layers 1122, 1124 can be different. In some embodiments, first and second intermediate layers 1122, 1124 can be a thin quadrilateral or cuboid. In some embodiments, first and second intermediate layers 1122, 1124 can be a thin disk or cylinder. In some embodiments, first and second intermediate layers 1122, 1124 can be an insulator, for example, a plastic. In some embodiments, first and second intermediate layers 1122, 1124 can be a metal, for example, aluminum. In some embodiments, first and second intermediate layers 1122, 1124 can be configured to set or control a predetermined thickness of reticle cage apparatus 1100. For example, first and second intermediate layers 1122, 1124 can have a substantially uniform thickness (height) in order to form a substantially uniform reticle cage apparatus 1100 thickness, for example, about 200 nm to about 5 mm between first substrate 1110 and reticle stage portion 1102 and about 200 nm to about 5 mm between second substrate 1112 and reticle stage portion 1102.

In some embodiments, first and second intermediate layers 1122, 1124 can include a ceramic. For example, first and second intermediate layers 1122, 1124 can include a glass or a tempered glass, for example, ZERODUR®. In some embodiments, first and second intermediate layers 1122, 1124 can include a polymer. For example, first and second intermediate layers 1122, 1124 can include plastics, fluoropolymers, polytetrafluoroethylene (e.g., TEFLON®), perfluoroelastomers (e.g., KALREZ®), polyether ether ketone, polyaryletherketone, polyetherimides (e.g., DURATON®), thermoplastics, or any combination thereof. In some embodiments, first and second intermediate layers 1122, 1124 can include a metal. For example, first and second intermediate layers 1122, 1124 can include aluminum, copper (e.g., oxygen-free high thermal conductivity), indium, magnesium, magnesium alloy (e.g., AZ80A-T5), molybdenum, steel, steel alloy (e.g., STAVAX®), gold, silver, nickel, or any combination thereof. In some embodiments, first and second intermediate layers 1122, 1124 can include a coating. For example, the coating can be a single or multi-layer and can include a ceramic, a polymer, a metal, or any combination thereof. In some embodiments, first intermediate layer 1122 can be a coating on first substrate 1110 or second substrate 1112. For example, as shown in FIG. 11, first intermediate layer 1122 can be a coating on first substrate 1110. In some embodiments, first intermediate layer 1122 can be a coating on first fastener 1104, second fastener 1106, and/or third fastener 1108. In some embodiments, second intermediate layer 1124 can be a coating on first substrate 1110 or second substrate 1112. For example, as shown in FIG. 11, second intermediate layer 1124 can be a coating on second substrate 1112. In some embodiments, second intermediate layer 1124 can be a coating on first fastener 1104, second fastener 1106, and/or third fastener 1108.

In some embodiments, first and second intermediate layers 1122, 1124 can include a stiffness substantially equivalent to that of reticle stage portion 1102. For example, first and second intermediate layers 1122, 1124 and reticle stage portion 1102 can both include a high stiffness material, for example, a stiffness greater than 1 MN/m. In some embodiments, first and second intermediate layers 1122, 1124 can have a lower elastic modulus (E) to that of reticle stage portion 1102. For example, reticle stage portion 1102 can include an elastic modulus of about 65 GPa, while first and second intermediate layers 1122, 1124 can include a lower elastic modulus of about 10 GPa.

In some embodiments, first and second intermediate layers 1122, 1124 can include a compression strength substantially equivalent to that of reticle stage portion 1102. For example, first and second intermediate layers 1122, 1124 and reticle stage portion 1102 can both include a high compression strength material, for example, a compression strength greater than 1 MPa. In some embodiments, first and second intermediate layers 1122, 1124 can have a lower ultimate tensile strength (UTS) to that of reticle stage portion 1102. For example, reticle stage portion 1102 can include a UTS of about 65 MPa, while first and second intermediate layers 1122, 1124 can include a lower UTS of about 10 MPa. In some embodiments, first and second intermediate layers 1122, 1124 can have a lower yield strength (YS) to that of reticle stage portion 1102. For example, reticle stage portion 1102 can include a yield strength of about 65 MPa, while first and second intermediate layers 1122, 1124 can include a lower yield strength of about 10 MPa.

In some embodiments, first and second intermediate layers 1122, 1124 can include a CTE substantially equivalent to that of reticle stage portion 1102. For example, first and second intermediate layers 1122, 1124 and reticle stage portion 1102 can both include a low CTE material or ULE material. In some embodiments, first and second intermediate layers 1122, 1124 can include a low CTE material or ULE material. For example, first and second intermediate layers 1122, 1124 can include ZERODUR®, a tempered ceramic, or a plastic, with a cross-sectional thickness of about 200 nm to about 5 mm. In some embodiments, first and second intermediate layers 1122, 1124 can include a zero CTE or substantially zero CTE ceramic.

In some embodiments, first and second intermediate layers 1122, 1124 can have a lower cross-sectional area to that of reticle stage portion 1102. For example, reticle stage portion 1102 can include a cross-sectional area of about 100 mm$^2$, while first and second intermediate layers 1122, 1124 can include a lower cross-sectional area of about 1 mm$^2$ to about 50 mm$^2$. In some embodiments, first and second intermediate layers 1122, 1124 can have a higher surface roughness to that of reticle stage portion 1102. For example, first and second intermediate layers 1122, 1124 can include an average surface roughness of about 100 nm, while reticle stage portion 1102 can include an average surface roughness of about 10 nm.

Figure 12:
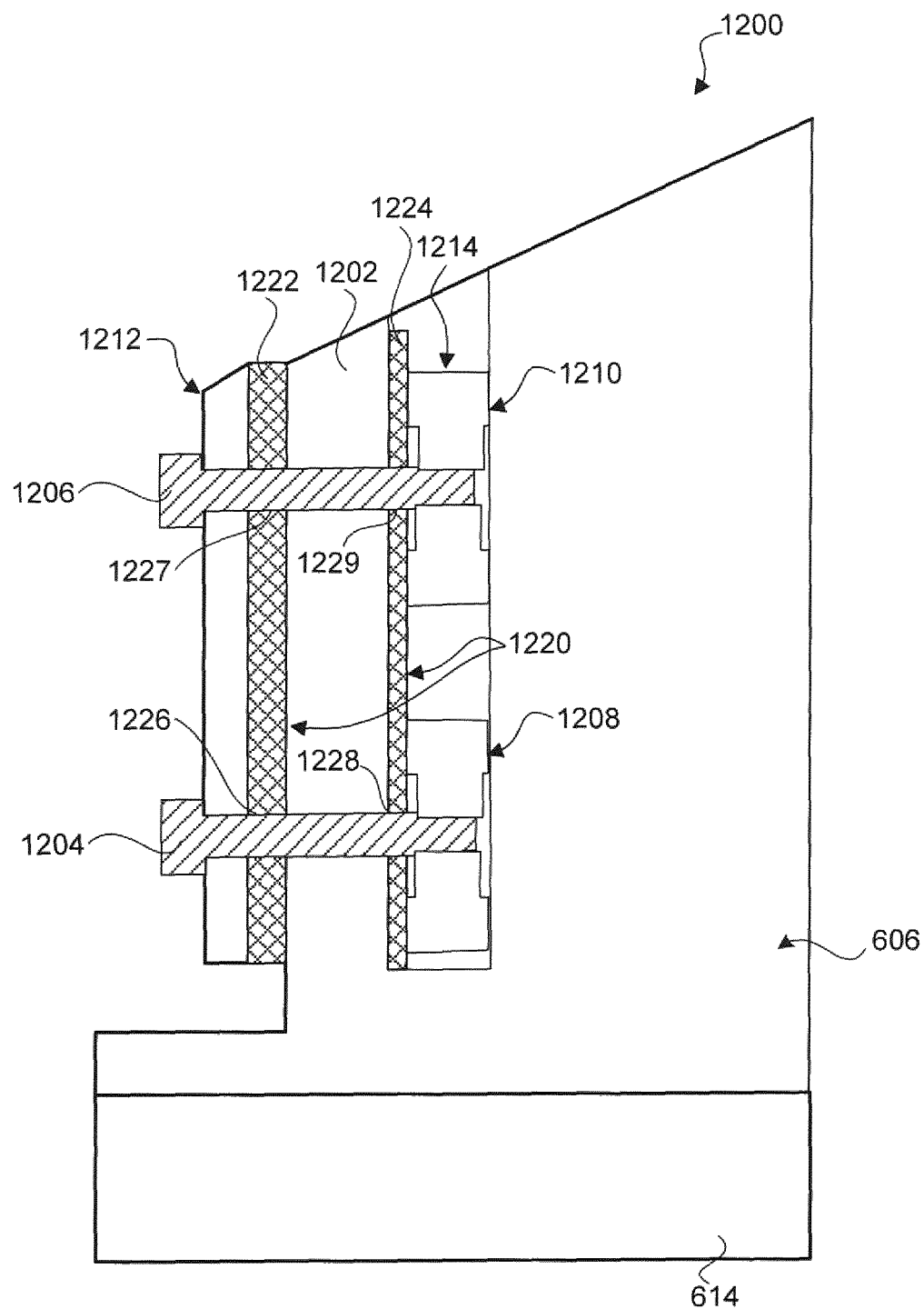
FIG. 12 is a cross-sectional schematic view of an exemplary apparatus, according to an exemplary embodiment.

FIG. 12 shows a cross-sectional schematic illustration of an exemplary magnetic actuator (Y-direction) apparatus 1200, as indicated in FIG. 10, according to some embodiments of this disclosure. Magnetic actuator (Y-direction) apparatus 1200 is similar to bonded apparatus 200 shown in FIGS. 2 and 3 and fastened apparatus 400 shown in FIGS. 4 and 5. As shown in FIG. 12, magnetic actuator (Y-direction) apparatus 1200 can be in a fastened configuration similar to that of fastened apparatus 400 shown in FIGS. 4 and 5. Alternatively, in some embodiments, magnetic actuator (Y-direction) apparatus 1200 can be in a bonded configuration similar to that of bonded apparatus 200 shown in FIGS. 2 and 3. Magnetic actuator (Y-direction) apparatus 1200 can include reticle stage portion 1202, first substrate 1212, second substrate 1214, first fastener 1206, 1210, second fastener 1204, 1208, and intermediate apparatus 1220. In some embodiments, magnetic actuator (Y-direction) apparatus 1200 can be implemented in lithographic apparatus LA.

Reticle stage portion 1202 can be part of reticle stage 600 shown in FIGS. 6 through 9. As shown in FIG. 12, reticle stage portion 1202 can be disposed along side stage surfaces 606 above second encoder 614. Reticle stage portion 1202 can be any shape or size and any material. For example, reticle stage portion 1202 can include a low CTE material or ULE material, for example, ZERODUR®. In some embodiments, reticle stage portion 1202 can include a zero CTE or substantially zero CTE ceramic. In some embodiments, reticle stage portion 1202 can be a metal, an insulator, a ceramic, a magnetic material, a glass, an optic, or any other suitable material.

First substrate 1212 can be any shape or size and any material. For example, first substrate 1212 can be part of a metal arm or extension for magnetic actuator (Y-direction) 706. In some embodiments, first substrate 1212 can be a metal, an insulator, a ceramic, a magnetic material, a glass, an optic, or any other suitable material that can be fastened by a fastener (e.g., bolt, clamp, nut, spring, etc.). Second substrate 1214 can be any shape or size and any material. For example, second substrate 1214 can be a ceramic ring nut, for example, first ring nut 1208 and/or second ring nut 1210, to secure magnetic actuator (Y-direction) 706 to reticle stage portion 1202. In some embodiments, second substrate 1214 can be a metal, an insulator, a ceramic, a magnetic material, a glass, an optic, or any other suitable material that can be fastened by a fastener. In some embodiments, first and second substrates 1212, 1214 can be a metal while reticle stage portion 1202 can be a ceramic (e.g., glass, ZERODUR®, etc.). In some embodiments, second substrate 1214 can be a metal while first substrate 1212 can be a ceramic (e.g., glass, ZERODUR®, etc.). In some embodiments, first and second substrates 1212, 1214 can be the same material, for example, a metal or a glass.

As shown in FIG. 12, first fastener 1204, 1208 and second fastener 1206, 1210 can be coupled to first substrate 1212, second substrate 1214, and reticle stage portion 1102. First fastener 1204, 1208 and second fastener 1206, 1210 can be configured to secure intermediate apparatus 1220 to first substrate 1212, second substrate 1214, and reticle stage portion 1202, and secure first and second substrates 1212, 1214 relative to the other. First fastener 1204, 1208 and second fastener 1206, 1210 can include a fastener (e.g., bolt, nut, clamp, spring, etc.). For example, as shown in FIG. 12, first fastener 1204, 1208 includes first bolt 1204 and corresponding first ring nut 1208, and second fastener 1206, 1210 includes second bolt 1206 and corresponding second ring nut 1210. In some embodiments, first fastener 1204, 1208 and/or second fastener 1206, 1210 can include first substrate 1212 or second substrate 1214. For example, as shown in FIG. 12, second substrate 1214 can include first ring nut 1208 and second ring nut 1210. In some embodiments, first fastener 1204, 1208 and second fastener 1206, 1210 can be configured to attach reticle stage portion 1202 and first and second substrates 1212, 1214 together. As shown in FIG. 12, magnetic actuator (Y-direction) apparatus 1200 can be in a fastened configuration, such that first and second substrates 1212, 1214 are fastened together to reticle stage portion 1202 by first fastener 1204, 1208 and/or second fastener 1206, 1210. In some embodiments, first fastener 1204, 1208 and/or second fastener 1206, 1210 can extend between reticle stage portion 1202 and first and second substrates 1212, 1214 around or through intermediate apparatus 1220. In some embodiments, first fastener 1204, 1208 and/or second fastener 1206, 1210 can include a ceramic, a polymer, a metal, or any combination thereof.

Intermediate apparatus 1220 can be disposed between first and second substrates 1212, 1214. In some embodiments, intermediate apparatus 1220 can include one or more intermediate layers. For example, as shown in FIG. 12, intermediate apparatus 1220 can include first intermediate layer 1222 and second intermediate layer 1224. First intermediate layer 1222 can be disposed between first substrate 1212 and reticle stage portion 1202. Second intermediate layer 1224 can be disposed between second substrate 1214 (e.g., first and second ring nuts 1208, 1210) and reticle stage portion 1202. Intermediate apparatus 1220 contacts reticle stage portion 1202, first and second substrates 1212, 1214, first fastener 1204, 1208, and/or second fastener 1206, 1210. In some embodiments, intermediate apparatus 1220 can include one or more apertures or vias. For example, as shown in FIG. 12, intermediate apparatus 1220 can include first intermediate layer 1222 with first apertures 1226, 1227 and second intermediate layer 1224 with second apertures 1228, 1229. First and second apertures 1226, 1227, 1228, 1229 can be configured to pass first bolt 1204 and second bolt 1206, respectively, through intermediate apparatus 1220 to secure first and second intermediate layers 1222, 1224 to reticle stage portion 1102 and first and second substrates 1212, 1214.

Intermediate apparatus 1220 is configured to be a first point of failure or breakage of magnetic actuator (Y-direction) apparatus 1200 under an applied force. Intermediate apparatus 1220 can act as a sacrificial apparatus or sacrificial layer in order to protect reticle stage portion 1202 and first and second substrates 1212, 1214, and reduce breakage and thermal stress in magnetic actuator (Y-direction) apparatus 1200. As a force or stress is applied to magnetic actuator (Y-direction) apparatus 1200, intermediate apparatus 1220 will break, fracture, or flex at a threshold force prior to breakage or fracture of reticle stage portion 1202 in order to absorb the energy of the applied force or stress. For example, intermediate apparatus 1220 will break, fracture, or flex at a threshold force of about 15 N, while reticle stage portion 1202 is stable up to a threshold force of about 40 N.

As shown in FIG. 12, intermediate apparatus 1220 can include first and second intermediate layers 1222, 1224. First and second intermediate layers 1222, 1224 can be any suitable shape or size and any material to help attach or secure reticle stage portion 1202 and first and second substrates 1212, 1214 together. In some embodiments, first and second intermediate layers 1222, 1224 can be the same. In some embodiments, first and second intermediate layers 1222, 1224 can be different. In some embodiments, first and second intermediate layers 1222, 1224 can be a thin quadrilateral or cuboid. In some embodiments, first and second intermediate layers 1222, 1224 can be a thin disk or cylinder. In some embodiments, first and second intermediate layers 1222, 1224 can be an insulator, for example, a plastic. In some embodiments, first and second intermediate layers 1222, 1224 can be a metal, for example, aluminum. In some embodiments, first and second intermediate layers 1222, 1224 can be configured to set or control a predetermined thickness of magnetic actuator (Y-direction) apparatus 1200. For example, first and second intermediate layers 1222, 1224 can have a substantially uniform thickness (height) in order to form a substantially uniform magnetic actuator (Y-direction) apparatus 1200 thickness, for example, about 200 nm to about 5 mm between first substrate 1212 and reticle stage portion 1202 and about 200 nm to about 5 mm between second substrate 1214 and reticle stage portion 1202.

In some embodiments, first and second intermediate layers 1222, 1224 can include a ceramic. For example, first and second intermediate layers 1222, 1224 can include a glass or a tempered glass, for example, ZERODUR®. In some embodiments, first and second intermediate layers 1222, 1224 can include a polymer. For example, first and second intermediate layers 1222, 1224 can include plastics, fluoropolymers, polytetrafluoroethylene (e.g., TEFLON®), perfluoroelastomers (e.g., KALREZ®), polyether ether ketone, polyaryletherketone, polyetherimides (e.g., DURATON®), thermoplastics, or any combination thereof. In some embodiments, first and second intermediate layers 1222, 1224 can include a metal. For example, first and second intermediate layers 1222, 1224 can include aluminum, copper (e.g., oxygen-free high thermal conductivity), indium, magnesium, magnesium alloy (e.g., AZ80A-T5), molybdenum, steel, steel alloy (e.g., STAVAX®), gold, silver, nickel, or any combination thereof. In some embodiments, first and second intermediate layers 1222, 1224 can include a coating. For example, the coating can be a single or multi-layer and can include a ceramic, a polymer, a metal, or any combination thereof. In some embodiments, first intermediate layer 1222 can be a coating on first substrate 1212 or second substrate 1214. For example, as shown in FIG. 12, first intermediate layer 1222 can be a coating on first substrate 1212. In some embodiments, first intermediate layer 1222 can be a coating on first fastener 1204, 1208 and second fastener 1206, 1210. In some embodiments, second intermediate layer 1224 can be a coating on first substrate 1212 or second substrate 1214. For example, as shown in FIG. 12, second intermediate layer 1224 can be a coating on second substrate 1214 (e.g., first ring nut 1208 and second ring nut 1210). In some embodiments, second intermediate layer 1224 can be a coating on first fastener 1204, 1208 and second fastener 1206, 1210. For example, as shown in FIG. 12, second intermediate layer 1224 can be a coating on first ring nut 1208 and second ring nut 1210.

In some embodiments, first and second intermediate layers 1222, 1224 can include a stiffness substantially equivalent to that of reticle stage portion 1202. For example, first and second intermediate layers 1222, 1224 and reticle stage portion 1202 can both include a high stiffness material, for example, a stiffness greater than 1 MN/m. In some embodiments, first and second intermediate layers 1222, 1224 can have a lower elastic modulus (E) to that of reticle stage portion 1202. For example, reticle stage portion 1202 can include an elastic modulus of about 65 GPa, while first and second intermediate layers 1222, 1224 can include a lower elastic modulus of about 10 GPa.

In some embodiments, first and second intermediate layers 1222, 1224 can include a compression strength substantially equivalent to that of reticle stage portion 1202. For example, first and second intermediate layers 1222, 1224 and reticle stage portion 1202 can both include a high compression strength material, for example, a compression strength greater than 1 MPa. In some embodiments, first and second intermediate layers 1222, 1224 can have a lower ultimate tensile strength (UTS) to that of reticle stage portion 1202. For example, reticle stage portion 1202 can include a UTS of about 65 MPa, while first and second intermediate layers 1222, 1224 can include a lower UTS of about 10 MPa. In some embodiments, first and second intermediate layers 1222, 1224 can have a lower yield strength (YS) to that of reticle stage portion 1202. For example, reticle stage portion 1202 can include a yield strength of about 65 MPa, while first and second intermediate layers 1222, 1224 can include a lower yield strength of about 10 MPa.

In some embodiments, first and second intermediate layers 1222, 1224 can include a CTE substantially equivalent to that of reticle stage portion 1202. For example, first and second intermediate layers 1222, 1224 and reticle stage portion 1202 can both include a low CTE material or ULE material. In some embodiments, first and second intermediate layers 1222, 1224 can include a low CTE material or ULE material. For example, first and second intermediate layers 1222, 1224 can include ZERODUR®, a tempered ceramic, or a plastic, with a cross-sectional thickness of about 200 nm to about 5 mm. In some embodiments, first and second intermediate layers 1222, 1224 can include a zero CTE or substantially zero CTE ceramic.

In some embodiments, first and second intermediate layers 1222, 1224 can have a lower cross-sectional area to that of reticle stage portion 1202. For example, reticle stage portion 1202 can include a cross-sectional area of about 100 mm$^2$, while first and second intermediate layers 1222, 1224 can include a lower cross-sectional area of about 1 mm$^2$ to about 50 mm$^2$. In some embodiments, first and second intermediate layers 1222, 1224 can have a higher surface roughness to that of reticle stage portion 1202. For example, first and second intermediate layers 1222, 1224 can include an average surface roughness of about 100 nm, while reticle stage portion 1202 can include an average surface roughness of about 10 nm.

Figure 13A:
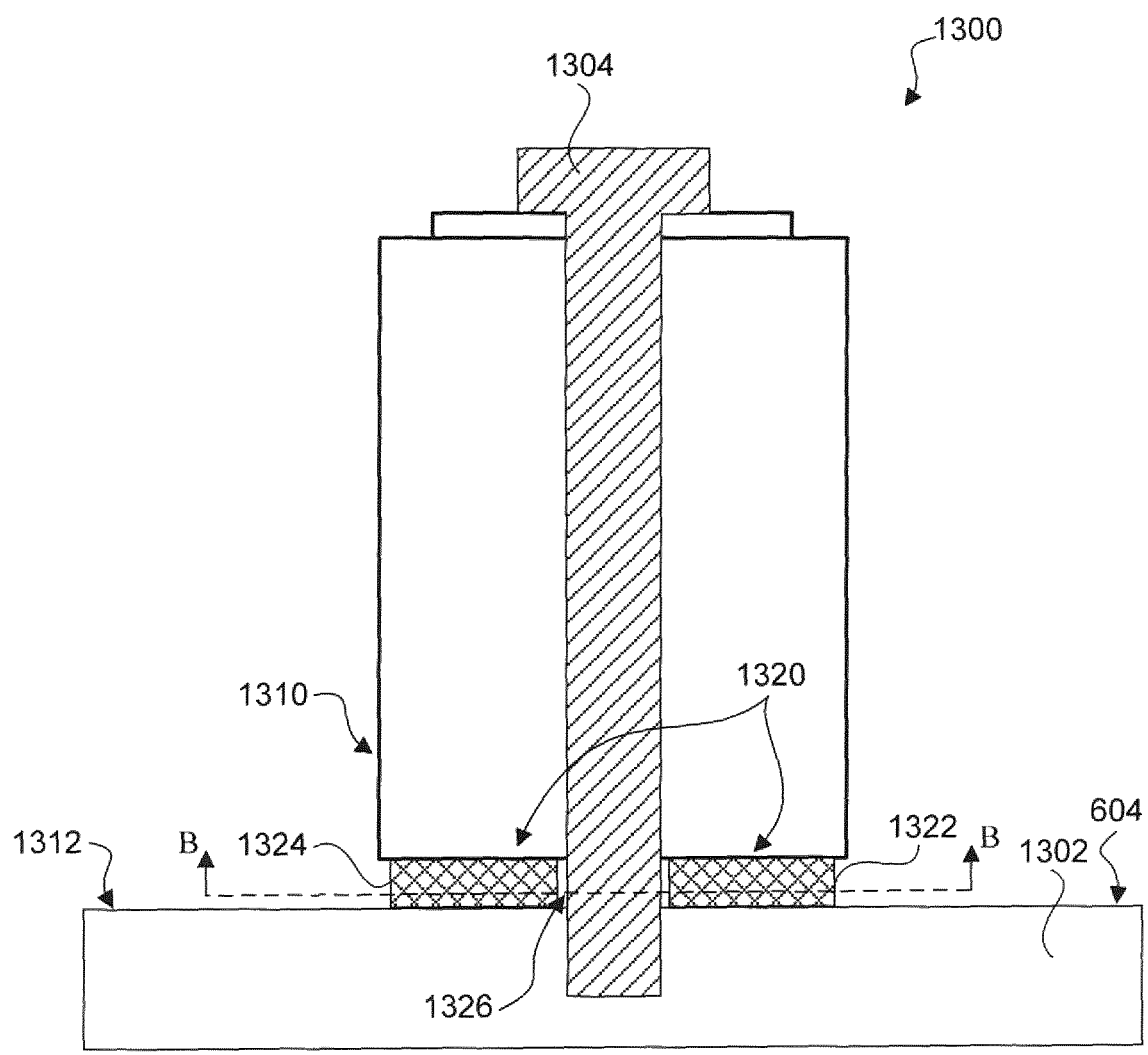
FIG. 13A is a cross-sectional schematic view of an exemplary apparatus, according to an exemplary embodiment.

FIG. 13A shows a cross-sectional schematic illustration of an exemplary magnetic actuator (Z-direction) apparatus 1300, as indicated in FIG. 10, according to some embodiments of this disclosure. Magnetic actuator (Z-direction) apparatus 1300 is similar to bonded apparatus 200 shown in FIGS. 2 and 3 and fastened apparatus 400 shown in FIGS. 4 and 5. As shown in FIG. 13A, magnetic actuator (Z-direction) apparatus 1300 can be in a fastened configuration similar to that of fastened apparatus 400 shown in FIGS. 4 and 5. Alternatively, in some embodiments, magnetic actuator (Z-direction) apparatus 1300 can be in a bonded configuration similar to that of bonded apparatus 200 shown in FIGS. 2 and 3. Magnetic actuator (Z-direction) apparatus 1300 can include reticle stage portion 1302, first substrate 1310, second substrate 1312, first fastener 1304, and intermediate apparatus 1320. In some embodiments, magnetic actuator (Z-direction) apparatus 1300 can be implemented in lithographic apparatus LA.

Reticle stage portion 1302 can be part of reticle stage 600 shown in FIGS. 6 through 9. As shown in FIG. 13A, reticle stage portion 1302 can be disposed below or near top stage surface 604. Reticle stage portion 1302 can be any shape or size and any material. For example, reticle stage portion 1302 can include a low CTE material or ULE material, for example, ZERODUR®. In some embodiments, reticle stage portion 1302 can include a zero CTE or substantially zero CTE ceramic. In some embodiments, reticle stage portion 1302 can be a metal, an insulator, a ceramic, a magnetic material, a glass, an optic, or any other suitable material.

First substrate 1310 can be any shape or size and any material. For example, first substrate 1310 can be a ceramic bottom cover for magnetic actuator (Z-direction) 708. In some embodiments, first substrate 1310 can be a metal, an insulator, a ceramic, a magnetic material, a glass, an optic, or any other suitable material that can be fastened by a fastener (e.g., bolt, clamp, nut, spring, etc.). Second substrate 1312 can be any shape or size and any material. For example, second substrate 1312 can be reticle stage portion 1302 and/or top stage surface 604 of reticle stage 600. In some embodiments, second substrate 1312 can be a metal, an insulator, a ceramic, a magnetic material, a glass, an optic, or any other suitable material that can be fastened by a fastener. In some embodiments, first substrate 1310 can be a metal while second substrate 1312 (i.e., reticle stage portion 1302) can be a ceramic (e.g., glass, ZERODUR®, etc.). In some embodiments, second substrate 1312 can be a metal while first substrate 1310 can be a ceramic (e.g., glass, ZERODUR®, etc.). In some embodiments, first and second substrates 1310, 1312 can be the same material, for example, a metal or a glass.

As shown in FIG. 13A, first fastener 1304 can be coupled to first substrate 1310 and second substrate 1312 (i.e., reticle stage portion 1302). First fastener 1304 can be configured to secure intermediate apparatus 1320 to first substrate 1310 and second substrate 1312, and secure first and second substrates 1310, 1312 relative to the other. First fastener 1304 can include a fastener (e.g., bolt, nut, clamp, spring, etc.). For example, as shown in FIG. 13A, first fastener 1304 can include a bolt. In some embodiments, first fastener 1304 can be configured to attach reticle stage portion 1302 and first substrate 1310 together. As shown in FIG. 13A, magnetic actuator (Z-direction) apparatus 1300 can be in a fastened configuration, such that first substrate 1310 is fastened to reticle stage portion 1302 by first fastener 1304. In some embodiments, first fastener 1304 can extend between reticle stage portion 1302 and first substrate 1310 around or through intermediate apparatus 1320. In some embodiments, first fastener 1304 can include a ceramic, a polymer, a metal, or any combination thereof.

Figure 13B:
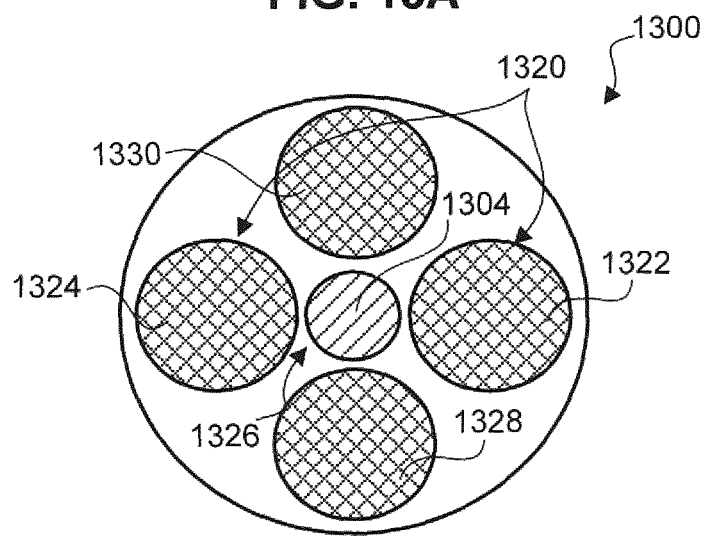
FIG. 13B is a cross-sectional bottom plan schematic view of the apparatus of FIG. 13A.

FIG. 13B shows a cross-sectional bottom plan schematic illustration of magnetic actuator (Z-direction) apparatus 1300, as indicated in FIG. 13A. Intermediate apparatus 1320 can be disposed between first and second substrates 1310, 1312. In some embodiments, intermediate apparatus 1320 can include one or more intermediate layers. For example, as shown in FIG. 13A, intermediate apparatus 1320 can include first intermediate layer 1322 and second intermediate layer 1324. Additionally, for example, as shown in FIG. 13B, magnetic actuator (Z-direction) apparatus 1300 can include third intermediate layer 1328 and fourth intermediate layer 1330. In some embodiments, first, second, third, and fourth intermediate layers 1322, 1324, 1328, 1340 can be arranged symmetrically about first fastener 1304. For example, as shown in FIG. 13B, first, second, third, and fourth intermediate layers 1322, 1324, 1328, 1330 can be spaced about 90 degrees relative to each other. First and second intermediate layers 1322, 1324 can be disposed between first substrate 1310 and reticle stage portion 1302. In some embodiments, first, second, third, and/or fourth intermediate layers 1322, 1324, 1328, 1330 can be disposed between first substrate 1310 and reticle stage portion 1302. Intermediate apparatus 1320 contacts reticle stage portion 1302, first substrate 1310, and first fastener 1304. In some embodiments, intermediate apparatus 1320 can include one or more apertures or vias. For example, as shown in FIG. 13A, intermediate apparatus 1320 can include first and second intermediate layers 1322, 1324 separated by first aperture 1326. First aperture 1326 can be configured to pass first fastener 1304 through intermediate apparatus 1320 to secure first and second intermediate layers 1322, 1324 (and, alternatively, third and/or fourth intermediate layers 1328, 1330) to reticle stage portion 1302 and first substrate 1310.

Intermediate apparatus 1320 is configured to be a first point of failure or breakage of magnetic actuator (Z-direction) apparatus 1300 under an applied force. Intermediate apparatus 1320 can act as a sacrificial apparatus or sacrificial layer in order to protect reticle stage portion 1302 and first substrate 1310, and reduce breakage and thermal stress in magnetic actuator (Z-direction) apparatus 1300. As a force or stress is applied to magnetic actuator (Z-direction) apparatus 1300, intermediate apparatus 1320 will break, fracture, or flex at a threshold force prior to breakage or fracture of reticle stage portion 1302 in order to absorb the energy of the applied force or stress. For example, intermediate apparatus 1320 will break, fracture, or flex at a threshold force of about 15 N, while reticle stage portion 1302 is stable up to a threshold force of about 40 N.

As shown in FIG. 13A, intermediate apparatus 1320 can include first and second intermediate layers 1322, 1324. As shown in FIG. 13B, intermediate apparatus 1320 can additionally include third and/or fourth intermediate layers 1328, 1330, which are similar to first and second intermediate layers 1322, 1324. First and second intermediate layers 1322, 1324 can be any suitable shape or size and any material to help attach or secure reticle stage portion 1302 and first substrate 1310 together. In some embodiments, first and second intermediate layers 1322, 1324 can be the same. In some embodiments, first and second intermediate layers 1322, 1324 can be different. In some embodiments, first and second intermediate layers 1322, 1324 can be a thin quadrilateral or cuboid. In some embodiments, first and second intermediate layers 1322, 1324 can be a thin disk or cylinder. In some embodiments, first and second intermediate layers 1322, 1324 can be an insulator, for example, a plastic. In some embodiments, first and second intermediate layers 1322, 1324 can be a metal, for example, aluminum. In some embodiments, first and second intermediate layers 1322, 1324 can be configured to set or control a predetermined thickness of magnetic actuator (Z-direction) apparatus 1300. For example, first and second intermediate layers 1322, 1324 can have a substantially uniform thickness (height) in order to form a substantially uniform magnetic actuator (Z-direction) apparatus 1300 thickness, for example, about 200 nm to about 5 mm between first substrate 1310 and reticle stage portion 1302.

In some embodiments, first and second intermediate layers 1322, 1324 can include a ceramic. For example, first and second intermediate layers 1322, 1324 can include a glass or a tempered glass, for example, ZERODUR®. In some embodiments, first and second intermediate layers 1322, 1324 can include a polymer. For example, first and second intermediate layers 1322, 1324 can include plastics, fluoropolymers, polytetrafluoroethylene (e.g., TEFLON®), perfluoroelastomers (e.g., KALREZ®), polyether ether ketone, polyaryletherketone, polyetherimides (e.g., DURATON®), thermoplastics, or any combination thereof. In some embodiments, first and second intermediate layers 1322, 1324 can include a metal. For example, first and second intermediate layers 1322, 1324 can include aluminum, copper (e.g., oxygen-free high thermal conductivity), indium, magnesium, magnesium alloy (e.g., AZ80A-T5), molybdenum, steel, steel alloy (e.g., STAVAX®), gold, silver, nickel, or any combination thereof. In some embodiments, first and second intermediate layers 1322, 1324 can include a coating. For example, the coating can be a single or multi-layer and can include a ceramic, a polymer, a metal, or any combination thereof. In some embodiments, first and/or second intermediate layers 1322, 1324 can be a coating on first substrate 1310. For example, as shown in FIG. 13B, first, second, third, and fourth intermediate layers 1322, 1324, 1328, 1330 can be a coating on first substrate 1310.

In some embodiments, first and second intermediate layers 1322, 1324 can include a stiffness substantially equivalent to that of reticle stage portion 1302. For example, first and second intermediate layers 1322, 1324 and reticle stage portion 1302 can both include a high stiffness material, for example, a stiffness greater than 1 MN/m. In some embodiments, first and second intermediate layers 1322, 1324 can have a lower elastic modulus (E) to that of reticle stage portion 1302. For example, reticle stage portion 1302 can include an elastic modulus of about 65 GPa, while first and second intermediate layers 1322, 1324 can include a lower elastic modulus of about 10 GPa.

In some embodiments, first and second intermediate layers 1322, 1324 can include a compression strength substantially equivalent to that of reticle stage portion 1302. For example, first and second intermediate layers 1322, 1324 and reticle stage portion 1302 can both include a high compression strength material, for example, a compression strength greater than 1 MPa. In some embodiments, first and second intermediate layers 1322, 1324 can have a lower ultimate tensile strength (UTS) to that of reticle stage portion 1302. For example, reticle stage portion 1302 can include a UTS of about 65 MPa, while first and second intermediate layers 1322, 1324 can include a lower UTS of about 10 MPa. In some embodiments, first and second intermediate layers 1322, 1324 can have a lower yield strength (YS) to that of reticle stage portion 1302. For example, reticle stage portion 1302 can include a yield strength of about 65 MPa, while first and second intermediate layers 1322, 1324 can include a lower yield strength of about 10 MPa.

In some embodiments, first and second intermediate layers 1322, 1324 can include a CTE substantially equivalent to that of reticle stage portion 1302. For example, first and second intermediate layers 1322, 1324 and reticle stage portion 1302 can both include a low CTE material or ULE material. In some embodiments, first and second intermediate layers 1322, 1324 can include a low CTE material or ULE material. For example, first and second intermediate layers 1322, 1324 can include ZERODUR®, a tempered ceramic, or a plastic, with a cross-sectional thickness of about 200 nm to about 5 mm. In some embodiments, first and second intermediate layers 1322, 1324 can include a zero CTE or substantially zero CTE ceramic.

In some embodiments, first and second intermediate layers 1322, 1324 can have a lower cross-sectional area to that of reticle stage portion 1302. For example, reticle stage portion 1302 can include a cross-sectional area of about 100 mm$^2$, while first and second intermediate layers 1322, 1324 can include a lower cross-sectional area of about 1 mm$^2$ to about 50 mm$^2$. In some embodiments, first and second intermediate layers 1322, 1324 can have a higher surface roughness to that of reticle stage portion 1302. For example, first and second intermediate layers 1322, 1324 can include an average surface roughness of about 100 nm, while reticle stage portion 1302 can include an average surface roughness of about 10 nm.

Figure 14A:
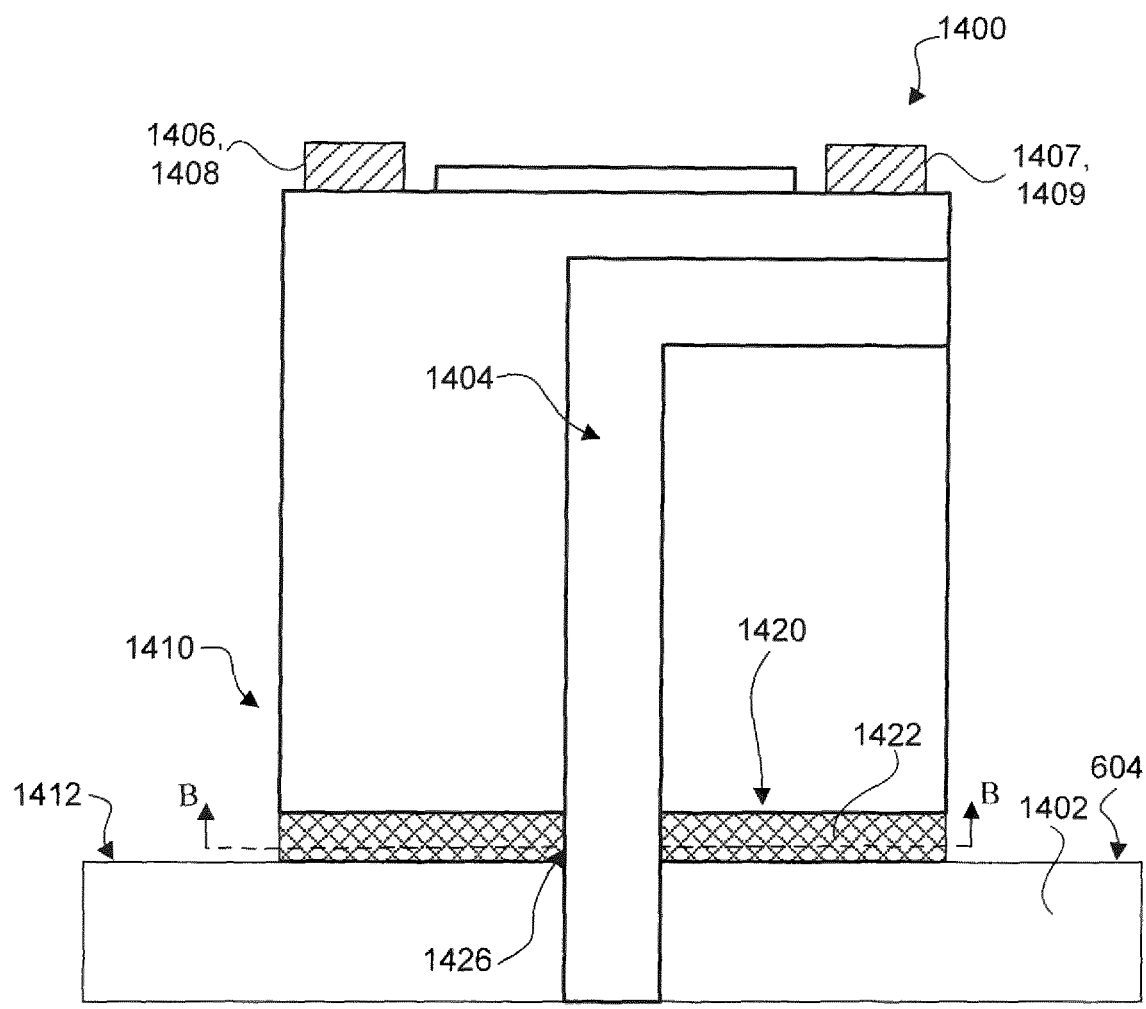
FIG. 14A is a cross-section schematic view of an exemplary apparatus, according to an exemplary embodiment.

FIG. 14A shows a cross-sectional schematic illustration of an exemplary connector apparatus 1400, as indicated in FIG. 10, according to some embodiments of this disclosure. Connector apparatus 1400 is similar to bonded apparatus 200 shown in FIGS. 2 and 3 and fastened apparatus 400 shown in FIGS. 4 and 5. As shown in FIG. 14A, connector apparatus 1400 can be in a fastened configuration similar to that of fastened apparatus 400 shown in FIGS. 4 and 5. Alternatively, in some embodiments, connector apparatus 1400 can be in a bonded configuration similar to that of bonded apparatus 200 shown in FIGS. 2 and 3. Connector apparatus 1400 can include reticle stage portion 1402, first substrate 1410, second substrate 1412, connector port 1404, first fastener 1406, second fastener 1407, third fastener 1408, fourth fastener 1409, and intermediate apparatus 1420. In some embodiments, connector apparatus 1400 can be implemented in lithographic apparatus LA.

Reticle stage portion 1402 can be part of reticle stage 600 shown in FIGS. 6 through 9. As shown in FIG. 14A, reticle stage portion 1402 can be disposed below or near top stage surface 604. Reticle stage portion 1402 can be any shape or size and any material. For example, reticle stage portion 1402 can include a low CTE material or ULE material, for example, ZERODUR®. In some embodiments, reticle stage portion 1402 can include a zero CTE or substantially zero CTE ceramic. In some embodiments, reticle stage portion 1402 can be a metal, an insulator, a ceramic, a magnetic material, a glass, an optic, or any other suitable material.

First substrate 1410 can be any shape or size and any material. For example, first substrate 1410 can be a ceramic bottom cover for connector 710. In some embodiments, first substrate 1410 can be a metal, an insulator, a ceramic, a magnetic material, a glass, an optic, or any other suitable material that can be fastened by a fastener (e.g., bolt, clamp, nut, spring, etc.). Second substrate 1412 can be any shape or size and any material. For example, second substrate 1412 can be reticle stage portion 1402 and/or top stage surface 604 of reticle stage 600. In some embodiments, second substrate 1412 can be a metal, an insulator, a ceramic, a magnetic material, a glass, an optic, or any other suitable material that can be fastened by a fastener. In some embodiments, first substrate 1410 can be a metal while second substrate 1412 (i.e., reticle stage portion 1402) can be a ceramic (e.g., glass, ZERODUR®, etc.). In some embodiments, second substrate 1412 can be a metal while first substrate 1410 can be a ceramic (e.g., glass, ZERODUR®, etc.). In some embodiments, first and second substrates 1410, 1412 can be the same material, for example, a metal or a glass.

As shown in FIG. 14A, first, second, third, and/or fourth fasteners 1406, 1407, 1408, 1409 can be coupled to first substrate 1410 and second substrate 1412 (i.e., reticle stage portion 1402). First, second, third, and/or fourth fasteners 1406, 1407, 1408, 1409 can be configured to secure intermediate apparatus 1420 to first substrate 1410 and second substrate 1412, and secure first and second substrates 1410, 1412 relative to the other. First, second, third, and/or fourth fasteners 1406, 1407, 1408, 1409 can include a fastener (e.g., bolt, nut, clamp, spring, etc.). For example, as shown in FIG. 13A, first, second, third, and fourth fasteners 1406, 1407, 1408, 1409 can include a bolt. In some embodiments, first, second, third, and/or fourth fasteners 1406, 1407, 1408, 1409 can be configured to attach reticle stage portion 1402 and first substrate 1410 together. As shown in FIG. 14A, connector apparatus 1400 can be in a fastened configuration, such that first substrate 1410 is fastened to reticle stage portion 1402 by first, second, third, and/or fourth fasteners 1406, 1407, 1408, 1409. In some embodiments, first, second, third, and/or fourth fasteners 1406, 1407, 1408, 1409 can extend between reticle stage portion 1402 and first substrate 1410 around or through intermediate apparatus 1420. In some embodiments, first, second, third, and/or fourth fasteners 1406, 1407, 1408, 1409 can include a ceramic, a polymer, a metal, or any combination thereof.

Figure 14B:
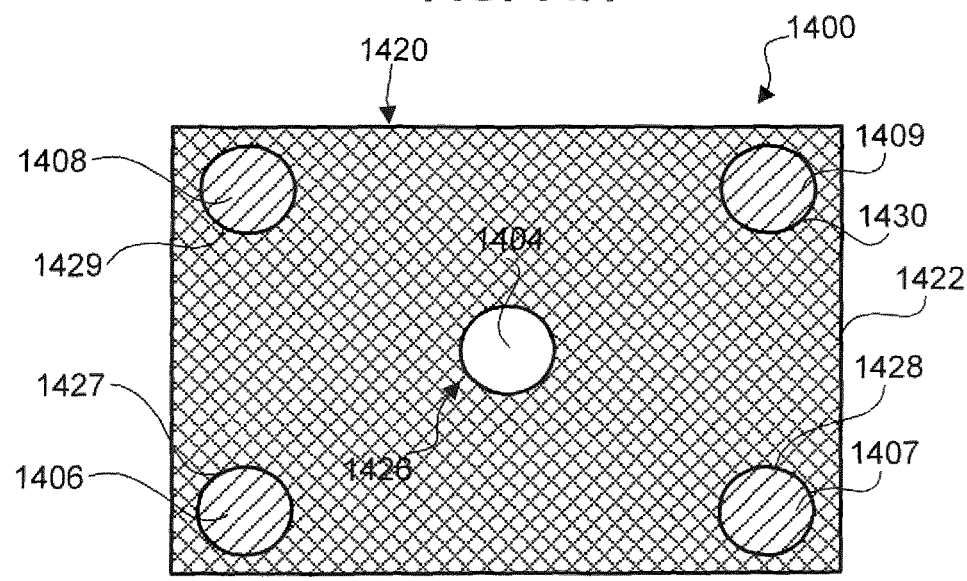
FIG. 14B is a cross-sectional bottom plan schematic view of the apparatus of FIG. 14A.

FIG. 14B shows a cross-sectional bottom plan schematic illustration of connector apparatus 1400, as indicated in FIG. 14A. Intermediate apparatus 1420 can be disposed between first and second substrates 1410, 1412. In some embodiments, intermediate apparatus can be a gasket. For example, as shown in FIG. 14B, intermediate apparatus 1420 can be a planar gasket with first port 1426 for connector port 1404 and first, second, third, and/or fourth apertures 1427, 1428, 1429, 1430 for corresponding first, second, third, and/or fourth fasteners 1406, 1407, 1408, 1409, respectively. In some embodiments, intermediate apparatus 1420 can include one or more intermediate layers. In some embodiments, intermediate apparatus 1420 can include a single layer. For example, as shown in FIG. 13A, intermediate apparatus 1420 can include first intermediate layer 1422. First intermediate layer 1422 can be disposed between first substrate 1410 and reticle stage portion 1402. Intermediate apparatus 1420 contacts reticle stage portion 1402, first substrate 1410, and first, second, third, and/or fourth fasteners 1406, 1407, 1408, 1409. In some embodiments, intermediate apparatus 1420 can include one or more apertures or vias. For example, as shown in FIG. 14A, intermediate apparatus 1420 can include first intermediate layer 1422 with first port 1426 for connector port 1404. For example, as shown in FIG. 14B, first intermediate layer 1422 can include first, second, third, and/or fourth apertures 1427, 1428, 1429, 1430, for example, arranged symmetrically about first port 1426. First, second, third, and/or fourth apertures 1427, 1428, 1429, 1430 can be configured to pass first, second, third, and/or fourth fasteners 1406, 1407, 1408, 1409, respectively, through intermediate apparatus 1420 to secure first intermediate layers 1422 to reticle stage portion 1402 and first substrate 1410.

Intermediate apparatus 1420 is configured to be a first point of failure or breakage of connector apparatus 1400 under an applied force. Intermediate apparatus 1420 can act as a sacrificial apparatus or sacrificial layer in order to protect reticle stage portion 1402 and first substrate 1410, and reduce breakage and thermal stress in connector apparatus 1400. As a force or stress is applied to connector apparatus 1400, intermediate apparatus 1420 will break, fracture, or flex at a threshold force prior to breakage or fracture of reticle stage portion 1402 in order to absorb the energy of the applied force or stress. For example, intermediate apparatus 1420 will break, fracture, or flex at a threshold force of about 15 N, while reticle stage portion 1402 is stable up to a threshold force of about 40 N.

As shown in FIG. 14A, intermediate apparatus 1420 can include first intermediate layer 1422. First intermediate layer 1422 can be any suitable shape or size and any material to help attach or secure reticle stage portion 1402 and first substrate 1410 together. In some embodiments, first intermediate layer 1422 can be a thin quadrilateral or cuboid. For example, as shown in FIG. 14B, first intermediate layer 1422 can be in the shape of a gasket for a gas or liquid connector. In some embodiments, first intermediate layer 1422 can be a thin disk or cylinder. In some embodiments, first intermediate layer 1422 can be an insulator, for example, a plastic. In some embodiments, first intermediate layer 1422 can be a metal, for example, aluminum. In some embodiments, first intermediate layer 1422 can be configured to set or control a predetermined thickness of connector apparatus 1400. For example, first intermediate layer 1422 can have a substantially uniform thickness (height) in order to form a substantially uniform connector apparatus 1400 thickness, for example, about 200 nm to about 5 mm between first substrate 1410 and reticle stage portion 1402.

In some embodiments, first intermediate layer 1422 can include a ceramic. For example, first intermediate layer 1422 can include a glass or a tempered glass, for example, ZERODUR®. In some embodiments, first intermediate layer 1422 can include a polymer. For example, first intermediate layer 1422 can include plastics, fluoropolymers, polytetrafluoroethylene (e.g., TEFLON®), perfluoroelastomers (e.g., KALREZ®), polyether ether ketone, polyaryletherketone, polyetherimides (e.g., DURATON®), thermoplastics, or any combination thereof. In some embodiments, first intermediate layer 1422 can include a metal. For example, first intermediate layer 1422 can include aluminum, copper (e.g., oxygen-free high thermal conductivity), indium, magnesium, magnesium alloy (e.g., AZ80A-T5), molybdenum, steel, steel alloy (e.g., STAVAX®), gold, silver, nickel, or any combination thereof. In some embodiments, first intermediate layer 1422 can include a coating. For example, the coating can be a single or multi-layer and can include a ceramic, a polymer, a metal, or any combination thereof. In some embodiments, first intermediate layer 1422 can be a coating on first substrate 1410. For example, as shown in FIG. 14B, first intermediate layer 1422 can be a coating on first substrate 1410.

In some embodiments, first intermediate layer 1422 can include a stiffness substantially equivalent to that of reticle stage portion 1402. For example, first intermediate layer 1422 and reticle stage portion 1402 can both include a high stiffness material, for example, a stiffness greater than 1 MN/m. In some embodiments, first intermediate layer 1422 can have a lower elastic modulus (E) to that of reticle stage portion 1402. For example, reticle stage portion 1402 can include an elastic modulus of about 65 GPa, while first intermediate layer 1422 can include a lower elastic modulus of about 10 GPa.

In some embodiments, first intermediate layer 1422 can include a compression strength substantially equivalent to that of reticle stage portion 1402. For example, first intermediate layer 1422 and reticle stage portion 1402 can both include a high compression strength material, for example, a compression strength greater than 1 MPa. In some embodiments, first intermediate layer 1422 can have a lower ultimate tensile strength (UTS) to that of reticle stage portion 1402. For example, reticle stage portion 1402 can include a UTS of about 65 MPa, while first intermediate layer 1422 can include a lower UTS of about 10 MPa. In some embodiments, first intermediate layer 1422 can have a lower yield strength (YS) to that of reticle stage portion 1402. For example, reticle stage portion 1402 can include a yield strength of about 65 MPa, while first intermediate layer 1422 can include a lower yield strength of about 10 MPa.

In some embodiments, first intermediate layer 1422 can include a CTE substantially equivalent to that of reticle stage portion 1402. For example, first intermediate layer 1422 and reticle stage portion 1402 can both include a low CTE material or ULE material. In some embodiments, first intermediate layer 1422 can include a low CTE material or ULE material. For example, first intermediate layer 1422 can include ZERODUR®, a tempered ceramic, or a plastic, with a cross-sectional thickness of about 200 nm to about 5 mm. In some embodiments, first intermediate layer 1422 can include a zero CTE or substantially zero CTE ceramic.

In some embodiments, first intermediate layer 1422 can have a lower cross-sectional area to that of reticle stage portion 1402. For example, reticle stage portion 1402 can include a cross-sectional area of about 100 $mm^2$, while first intermediate layer 1422 can include a lower cross-sectional area of about 1 $mm^2$ to about 50 $mm^2$. In some embodiments, first intermediate layer 1422 can have a higher surface roughness to that of reticle stage portion 1402. For example, first intermediate layer 1422 can include an average surface roughness of about 100 nm, while reticle stage portion 1402 can include an average surface roughness of about 10 nm.

The embodiments may further be described using the following clauses:

1. A lithography system comprising:
    a radiation source for providing radiation energy to a reticle;
    a reticle stage configured to hold the reticle; and
    an intermediate apparatus coupled to the reticle stage, the intermediate apparatus comprising:
    a first substrate;
    a second substrate; and
    an intermediate layer disposed between the first and second substrates,
    wherein the intermediate layer is configured to be a first point of failure or breakage of the intermediate apparatus under an applied force, and
    wherein the intermediate layer comprises a low coefficient of thermal expansion or ultra-low expansion material.
2. The apparatus of clause 1, wherein the intermediate apparatus is configured to reduce damage to the reticle stage under the applied force.

3. The apparatus of clause 1, further comprising a clamp coupled to the reticle stage and configured to secure the reticle.
4. The apparatus of clause 1, wherein the radiation energy is extreme ultraviolet (EUV) radiation.
5. The apparatus of clause 1, wherein the intermediate layer comprises ZERODUR®, a tempered ceramic, or a plastic.
6. An apparatus for a reticle stage in a lithographic apparatus, comprising:
   a first substrate;
   a second substrate; and
   an intermediate layer disposed between the first and second substrates,
   wherein the intermediate layer is configured to be a first point of failure or breakage of the apparatus under an applied force, and
   wherein the apparatus is coupled to the reticle stage and configured to reduce damage to the reticle stage under the applied force.
7. The apparatus of clause 6, wherein the intermediate layer has a stiffness, a compression strength, or a coefficient of thermal expansion substantially equivalent to that of the second substrate.
8. The apparatus of clause 6, wherein the intermediate layer has a lower ultimate tensile strength to that of the second substrate.
9. The apparatus of clause 6, wherein the intermediate layer has a lower cross-sectional area to that of the second substrate.
10. The apparatus of clause 6, wherein the intermediate layer has a higher surface roughness to that of the second substrate.
11. The apparatus of clause 6, wherein the intermediate layer comprises a low coefficient of thermal expansion or ultra-low expansion material.
12. The apparatus of clause 11, wherein the intermediate layer comprises ZERODUR®, a tempered ceramic, or a plastic.
13. The apparatus of clause 6, wherein the second substrate comprises a low coefficient of thermal expansion or ultra-low expansion material.
14. The apparatus of clause 6, further comprising a bonding layer disposed between the first and second substrates, wherein the bonding layer is configured to bond the intermediate layer to the first and second substrates.
15. The apparatus of clause 14, wherein the intermediate layer comprises a groove configured to ventilate the bonding layer.
16. The apparatus of clause 14, wherein the bonding layer comprises an epoxy, elastomer, or thermoplastic.
17. An apparatus for a reticle stage in a lithographic apparatus, comprising:
   a first substrate;
   a second substrate;
   an intermediate layer disposed between the first and second substrates, wherein the intermediate layer is configured to be a first point of failure or breakage of the apparatus under an applied force; and
   a fastener coupled to the first and second substrates, wherein the fastener is configured to secure the intermediate layer to the first and second substrates, and
   wherein the apparatus is coupled to the reticle stage and configured to reduce damage to the reticle stage under the applied force.
18. The apparatus of clause 17, wherein the intermediate layer has a lower elastic modulus to that of the first and second substrates.
19. The apparatus of clause 17, wherein the intermediate layer has a lower yield strength to that of the first and second substrates.
20. The apparatus of clause 17, wherein the intermediate layer has a lower cross-sectional area to that of the second substrate.
21. The apparatus of clause 17, wherein the intermediate layer has a higher surface roughness to that of the second substrate.
22. The apparatus of clause 17, wherein the intermediate layer comprises a polymer or a metal.
23. The apparatus of clause 17, wherein the intermediate layer comprises a coating applied to the first substrate or the second substrate.
24. The apparatus of clause 17, further comprising a second intermediate layer disposed between the first substrate and the fastener or the second substrate and the fastener.
25. The apparatus of clause 17, wherein the fastener comprises a bolt, a nut, a clamp, a spring, or some combination thereof.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may be made in this text to embodiments of the disclosure in the context of a lithographic apparatus, embodiments of the disclosure may be used in other apparatuses. Embodiments of the disclosure may form part of a mask inspection apparatus, a metrology apparatus, or any apparatus that measures or processes an object such as a wafer (or other substrate) or mask (or other patterning device). These apparatuses may be generally referred to as lithographic tools. Such lithographic tools may use vacuum conditions or ambient (non-vacuum) conditions.

Although specific reference may have been made above to the use of embodiments of the disclosure in the context of optical lithography, it will be appreciated that the disclosure, where the context allows, is not limited to optical lithography and may be used in other applications, for example imprint lithography.

It is to be understood that the phraseology or terminology herein is for the purpose of description and not of limitation, such that the terminology or phraseology of the present specification is to be interpreted by those skilled in relevant art(s) in light of the teachings herein.

The above examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific embodiments of the disclosure have been described above, it will be appreciated that the disclosure may be practiced otherwise than as described. The descriptions above are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A lithography system comprising:
   a radiation source for providing radiation energy to a reticle;
   a reticle stage configured to hold the reticle; and
   an intermediate apparatus coupled to the reticle stage, the intermediate apparatus comprising:
      a first substrate;
      a second substrate; and
      an intermediate layer disposed between the first and second substrates,
      wherein the intermediate layer is configured to be a first point of failure or breakage of the intermediate apparatus under an applied force, and
      wherein the intermediate layer comprises a low coefficient of thermal expansion or ultra-low expansion material.

2. The lithography system of claim 1, wherein the intermediate apparatus is configured to reduce damage to the reticle stage under the applied force.

3. The lithography system of claim 1, further comprising a clamp coupled to the reticle stage and configured to secure the reticle.

4. The lithography system of claim 1, wherein the radiation energy is extreme ultraviolet (EUV) radiation.

5. The lithography system of claim 1, wherein the intermediate layer comprises ZERODUR®, a tempered ceramic, or a plastic.

6. An apparatus for a reticle stage in a lithographic apparatus, comprising:
   a first substrate;
   a second substrate; and
   an intermediate layer disposed between the first and second substrates,
   wherein the intermediate layer is configured to be a first point of failure or breakage of the apparatus under an applied force, and
   wherein the apparatus is coupled to the reticle stage and configured to reduce damage to the reticle stage under the applied force.

7. The apparatus of claim 6, wherein the intermediate layer has a stiffness, a compression strength, or a coefficient of thermal expansion substantially equivalent to that of the second substrate.

8. The apparatus of claim 6, wherein the intermediate layer has a lower ultimate tensile strength to that of the second substrate.

9. The apparatus of claim 6, wherein the intermediate layer has a lower cross-sectional area to that of the second substrate.

10. The apparatus of claim 6, wherein the intermediate layer has a higher surface roughness to that of the second substrate.

11. The apparatus of claim 6, wherein the intermediate layer comprises a low coefficient of thermal expansion or ultra-low expansion material.

12. The apparatus of claim 6, wherein the intermediate layer comprises ZERODUR®, a tempered ceramic, or a plastic.

13. The apparatus of claim 6, wherein the second substrate comprises a low coefficient of thermal expansion or ultra-low expansion material.

14. The apparatus of claim 6, further comprising:
   a bonding layer disposed between the first and second substrates,
   wherein the bonding layer is configured to bond the intermediate layer to the first and second substrates.

15. The apparatus of claim 14, wherein the intermediate layer comprises a groove configured to ventilate the bonding layer.

16. The apparatus of claim 14, wherein the bonding layer comprises an epoxy, elastomer, or thermoplastic.

* * * * *